US007017090B2

(12) United States Patent
Endou et al.

(10) Patent No.: US 7,017,090 B2
(45) Date of Patent: *Mar. 21, 2006

(54) SEMICONDUCTOR MODULE INCLUDING SEMICONDUCTOR MEMORY DEVICE SHIFTABLE TO TEST MODE AS WELL AS SEMICONDUCTOR MEMORY DEVICE USED THEREIN

(75) Inventors: Shunsuke Endou, Hyogo (JP);
Takayuki Miyamoto, Hyogo (JP); Jun Nakai, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 495 days.

This patent is subject to a terminal disclaimer.

(21) Appl. No.: 10/120,574

(22) Filed: Apr. 12, 2002

(65) Prior Publication Data
US 2003/0026139 A1 Feb. 6, 2003

(30) Foreign Application Priority Data
Aug. 2, 2001 (JP) ............................. 2001-234755

(51) Int. Cl.
*G11C 29/00* (2006.01)
(52) U.S. Cl. ..................................... 714/718
(58) Field of Classification Search ................ 714/718
See application file for complete search history.

(56) References Cited
U.S. PATENT DOCUMENTS
5,687,179 A * 11/1997 Whetsel et al. ............. 714/726

| | | | | |
|---|---|---|---|---|
| 5,717,652 A * | 2/1998 | Ooishi | ......................... | 365/233 |
| 6,301,184 B1 * | 10/2001 | Sasaki et al. | ................ | 365/226 |
| 6,324,118 B1 * | 11/2001 | Ooishi | ......................... | 365/233 |
| 6,385,125 B1 * | 5/2002 | Ooishi et al. | ................ | 365/233 |
| 6,489,819 B1 * | 12/2002 | Kono et al. | .................. | 327/141 |
| 6,522,599 B1 * | 2/2003 | Ooishi et al. | ................ | 365/233 |
| 6,545,925 B1 * | 4/2003 | Lee | ............................ | 365/222 |
| 6,646,936 B1 * | 11/2003 | Hamamatsu et al. | ........ | 365/201 |
| 6,678,205 B1 * | 1/2004 | Johnson et al. | ............. | 365/233 |
| 6,707,735 B1 * | 3/2004 | Makabe et al. | ............. | 365/201 |

FOREIGN PATENT DOCUMENTS
| JP | 6-267297 | 9/1994 |
|---|---|---|
| JP | 8-31197 | 2/1996 |
| JP | 2000-215695 | 8/2000 |

* cited by examiner

Primary Examiner—Stephen M. Baker
(74) Attorney, Agent, or Firm—McDermott Will & Emery LLP

(57) ABSTRACT

A semiconductor module includes a plurality of semiconductor memory devices, a registered buffer, a PLL circuit and a test mode entry circuit. The test mode entry circuit receives a signal MRS, a bank address signal and an address signal from the registered buffer, directly and externally receives a signal formed of a high voltage level higher than the voltage level in a normal operating range, generates a deactivating signal for deactivating the PLL circuit and a test mode shift signal formed of the high voltage level, applying the deactivating signal to the PLL circuit, and applying the test mode shift signal to the plurality of semiconductor memory devices. Consequently, the plurality of semiconductor memory devices included in the module can be shifted to the test mode in the modular state.

17 Claims, 22 Drawing Sheets

SEMICONDUCTOR MODULE INCLUDING SEMICONDUCTOR MEMORY DEVICE SHIFTABLE TO TEST MODE AS WELL AS SEMICONDUCTOR MEMORY DEVICE USED THEREIN

BACKGROUND OF THE INVENTION

1. Field of the Invention

The present invention relates to a semiconductor module including a plurality of semiconductor memory devices, and particularly relates to a semiconductor module, which allows the semiconductor memory devices in the module to shift to a test mode for testing a special operation, as well as the semiconductor memory devices used therein.

2. Description of the Background Art

In recent years, attention has been given to a DIMM (Double Inline Memory Module), which operates in synchronization with a clock signal having a frequency of 50 MHz or more. The DIMM has two semiconductor modules formed on the opposite sides of one substrate, respectively. The semiconductor module includes a plurality of DRAMs (Dynamic Random Access Memories).

In particular, the semiconductor module used in a registered DIMM (RDIMM) includes a plurality of DRAMs, a PLL circuit and a registered buffer circuit. The PLL circuit generates a clock signal having a frequency of 50 MHz or more and adjusts timing, according to which various signals and data are applied to the plurality of DRAMs. The registered buffer circuit receives the control signal, data and address signal, which are externally applied, and converts the voltage levels forming the control signals and others to the voltage levels to be used in the semiconductor module for applying them to the plurality of DRAMs.

The DRAMs used in the RDIMM are subjected to a test of an operation within the normal specifications and a test of a special operation not defined by the normal specifications in a production process. By these tests, faulty pieces are detected and removed.

The DRAM includes a test mode circuit shown in FIG. 23. The test mode circuit generates a test mode signal for shifting the DRAM to a test mode, in which the special operation test is performed based on an externally supplied predetermined signal. When the test mode signal is generated, the test of the special operation not defined by the normal specifications is performed in the DRAM.

Referring to FIG. 23, test mode circuit 600 included in the DRAM includes hold circuits 601–603, AND gates 604 and 605, and an SVIH detector 606. Hold circuit 601 holds a signal MRS, which attains H-level (logical high level) when row address strobe signal /RAS, column address strobe signal /CAS and write enable signal /WE are all at L-level (logical low level), for a predetermined period, and then outputs hold signal MRSH to AND gates 604 and 605. Hold circuit 602 holds a bank address signal BA1 for a predetermined period, and then outputs a hold signal BA1H to AND gates 604 and 605. Hold circuit 603 holds an address signal ADD7 for a predetermined period, and then outputs a hold signal ADD7H to AND gates 604 and 605.

AND gate 605 performs logical AND among three hold signals MRSH, BA1H and ADD7H, and outputs a signal SVDENE to an SVIH detector 606. SVIH detector 606 is activated when it receives signal SVDENE of H-level, and makes a comparison between a voltage level of a signal SVIH, which is applied via a pin receiving bank address signal BA0, and a reference voltage level VREF. When the voltage level of bank address signal BA0 is higher than reference voltage level VREF, signal BA0S of H-level is output to AND gate 604. When the voltage level of bank address signal BA0 is lower than reference voltage level VREF, signal BA0S of L-level is output to AND gate 604. AND gate 604 performs the logical AND among hold signals MRSH, BA1H and ADD7H and signal BA0S, and outputs a result thereof as a test mode signal TM.

Referring to FIG. 24, description will now be given on an operation of producing test mode signal TM by test mode circuit 600. For shifting the DRAM to the test mode, the DRAM is supplied with row address strobe signal /RAS of L-level, column address strobe signal /CAS of L-level, write enable signal /WE of L-level, bank address signal BA1 of H-level, address signal ADD7 of H-level and signal SVIH, which is formed of a voltage level higher than the voltage level in a normal operating range. Thereby, hold circuits 601–603 of test mode circuit 600 produce hold signals MRSH, BA1H and ADD7H of H-level for a predetermined period, respectively, and output them to AND gates 604 and 605.

AND gate 605 performs logical AND among three hold signals MRSH, BA1H and ADD7H to produce signal SVDENE of H-level, and sends it to SVIH detector 606. Thereby, SVIH detector 606 is activated to compare the voltage level of signal SVIH with reference voltage level VREF, and issues signal BA0S, which is formed of the logical level corresponding to a result of the comparison, to AND gate 604. For shifting to the test mode, signal SVIH is formed of the voltage level higher than the voltage level in the normal operating range so that SVIH detector 606 outputs signal BA0S at H-level to AND gate 604.

Accordingly, SVIH detector 606 is activated at timing T2 after elapsing of a predetermined period from timing T1, at which hold signals MRSH, BA1H and ADD7H rise to H-level, and it is determined between timing T2 and timing T3 whether the voltage level of signal SVIH is higher than reference voltage level VREF or not.

AND gate 604 performs the logical AND among received hold signals MRSH, BA1H and ADD7H, and signal BA0S, and generates test mode signal TM of H-level.

As described above, test mode circuit 600 generates test mode signal TM after elapsing of a detector activation time, which is required from start of shift to the test mode to activation of SVIH detector 606, and a determination time required for determining whether the voltage level of signal SVIH is higher than reference voltage level VREF or not. Thus, test mode circuit 600 requires a time T for activating the detector and detecting signal SVIH.

The DRAM is shifted to the test mode, and the test of the special operation is performed. DRAMs, in which a failure was detected in the special operation test, are eliminated, and only DRAMs, in which no failure was detected, are assembled into the semiconductor modules to produce the RDIMMs.

The RDIMM thus produced is not subjected to the test of the special operation not defined by the normal specifications, and is subjected only to the test of the operation defined by the normal specifications before shipment.

However, it has been recently required to perform the special operation test in the state of RDIMM, i.e., in the modular state. However, the RDIMM is provided with a registered buffer circuit, which lowers the voltage level of signal SVIH to the voltage level to be used within the module when signal SVIH formed of the voltage level higher than the voltage level in the normal operating range is externally supplied and applies the lowered signal SVIH to the DRAM. Therefore, such a problem occurs that each of the DRAMs in the module cannot be shifted to the test mode for performing the special operation test.

As described above, the test mode circuit mounted on the DRAM is provided with the SVIH detector requiring the detector activation time and the determination time for detecting signal SVIH. Therefore, it is impossible to detect signal SVIH within one cycle of the clock signal having a frequency of 50 MHz or more, at which RDIMM operates, and each DRAM in the module cannot shift to the test mode. Thus, the time T is required for the activating of the detector and the detection of signal SVIH, and this time T cannot be shorter than one cycle of the clock signal so that each DRAM cannot shift to the test mode.

SUMMARY OF THE INVENTION

Accordingly, an object of the invention is to provide a semiconductor module, in which a plurality of semiconductor memory devices included in the module can be shifted to a test mode.

Another object of the invention is to provide a semiconductor memory device, which can be shifted to a test mode in the semiconductor module, i.e., in such a state that it is assembled in the module.

According to the invention, a semiconductor module for operating at a second speed faster than a first speed and for shifting of semiconductor memory devices to an individual device test mode, includes a PLL circuit for generating a clock signal formed of a frequency achieving the second speed; a registered buffer circuit for converting an externally supplied input signal to an input signal formed of an internally used voltage level, and outputting the converted input signal in synchronization with the clock signal; a plurality of semiconductor memory devices for receiving the converted input signal from the registered buffer circuit and operating in synchronization with the clock signal; and a test mode entry circuit for producing, in accordance with a request for a shift to a test mode, a test mode shift signal for shifting the semiconductor memory devices to the test mode, the test mode being used for individually testing each of the plurality of semiconductor memory devices, and applying the produced test mode shift signal to each of the plurality of semiconductor memory devices. Each of the plurality of semiconductor memory devices includes a memory cell array including a plurality of memory cells, a peripheral circuit for inputting/outputting of data to and from each of the plurality of memory cells, and a test mode circuit for generating a test mode signal for testing a special operation different from a normal operation based on the test mode shift signal. The peripheral circuit performs input/output of data used for testing the special operation to and from each of the plurality of memory cells in accordanc.e with the test mode signal.

In the semiconductor module according to the invention, the test mode entry circuit produces the test mode shift signal for shifting the semiconductor memory device in the module to the test mode, and applies it to the semiconductor memory device. In the semiconductor memory device, the test mode signal is produced based on the test mode shift signal so that the test of the special operation is performed. According to the invention, therefore, the semiconductor memory device can be shifted to the test mode in the semiconductor module, i.e., in such a state that it is assembled in the module.

Preferably, the test mode circuit generates the test mode signal when the voltage level of the test mode shift signal is higher than a reference voltage level, and the test mode entry circuit produces the test mode shift signal formed of a high voltage level higher than the reference voltage level and higher than a voltage level in a normal operating range, and applies the test mode shift signal to the test mode circuit.

The test mode circuit of the semiconductor memory device receives the test mode shift signal, which is formed of the voltage level higher than the voltage level in the normal operating range, from the test mode entry circuit, and generates the test mode signal. According to the invention, therefore, the semiconductor memory device in the module can be shifted to the test mode by the same operation as that for shifting the semiconductor memory device alone to the test mode.

Preferably, the test mode entry circuit generates a deactivating signal for deactivating the PLL circuit and the test mode shift signal based on a predetermined signal which is sent from the registered buffer circuit and indicates request for shift to the test mode and an externally applied external input signal formed of the high voltage level, applies the generated deactivating signal to the PLL circuit, and applies the generated test mode shift signal to the semiconductor memory device.

When shifting to the test mode, the semiconductor memory device is released from the operation synchronized with the clock signal, and shifts to the test mode based on the test mode shift signal. According to the invention, therefore, the semiconductor memory device in the module can be shifted to the test mode by the same operation as that for shifting the semiconductor memory device to an individual device test mode.

Preferably, the test mode entry circuit includes a first signal generating circuit for producing the deactivating signal based on the predetermined signal, and a second signal generating circuit being deactivated by receiving the deactivating signal to produce the test mode shift signal when the voltage level of the external input signal is higher than the reference voltage level.

When shifting to the test mode, the semiconductor memory device is shifted to the test mode in accordance with deactivation of the PLL circuit. According to the invention, therefore, the semiconductor memory device in the module can be accurately shifted to the test mode.

Preferably, the test mode entry circuit externally receives a predetermined signal requesting shift to the test mode and an external input signal formed of the high voltage level, and applies the external input signal as the test mode shift signal to the semiconductor memory device.

When shifting to the test mode, the semiconductor memory device directly receives the externally applied external input signal formed of the high voltage level. According to the invention, therefore, the semiconductor memory device in the module can be shifted to the test mode by the same operation as that for shifting the semiconductor memory device to an individual device test mode.

Preferably, the test mode circuit is activated in one cycle of the clock signal to detect the test mode shift signal and generate the test mode signal in the subsequent cycle.

In the test mode, the bypass signal is generated. When the bypass signal is generated, the external input signal formed of the high voltage level is directly applied to the semiconductor memory device. According to the invention, therefore, the semiconductor memory device in the module can accurately shift to the test mode.

Preferably, the test mode circuit is activated in one cycle of the clock signal to detect the test mode shift signal and generate the test mode signal in one subsequent cycle continuing to the one cycle.

The activation of the test mode circuit and the detection of the test mode shift signal are performed in the two cycles of the clock signal. In the semiconductor module operating in synchronization with the clock signal of a high frequency, therefore, the semiconductor memory device can be shifted in synchronization with the clock signal.

Preferably, the test mode circuit includes a detecting circuit being activated in the one cycle based on a predetermined signal sent from the registered buffer circuit to detect the test mode shift signal in the subsequent one cycle, and a signal generating circuit for generating the test mode signal in the subsequent one cycle when the detecting circuit detects the test mode shift signal.

When the test mode circuit is activated, the detection of the test mode shift signal and the generation of the test mode signal are performed within one cycle of the clock signal. According to the invention, therefore, the semiconductor memory device in the module can be rapidly shifted to the test mode.

Preferably, the detecting circuit includes a signal generating circuit for generating an activating signal in the one cycle based on the predetermined signal, and a comparing circuit being activated in the subsequent one cycle based on the activating signal to compare the voltage level of the test mode shift signal with the reference voltage level to output a result of the comparison in the subsequent one cycle, and the signal generating circuit generates the test mode signal when the voltage level of the test mode shift signal is higher than the reference voltage level.

When the activating signal is generated, the voltage level of the test mode shift signal is compared with the reference voltage level in one cycle of the clock signal, and the test mode signal is generated. According to the invention, therefore, the test mode shift signal of a level higher than the reference voltage level can be applied to the semiconductor memory device, whereby the semiconductor memory device can be rapidly shifted to the test mode in the module.

According to the invention, a semiconductor module for operating at a second speed higher than a first speed and for shifting of semiconductor memory devices to an individual-device test mode, includes a PLL circuit for generating a clock signal formed of a frequency achieving the second speed; a registered buffer circuit for converting an externally applied input signal to an input signal formed of an internally used voltage level, and outputting the converted input signal in synchronization with the clock signal; and a plurality of semiconductor memory devices for receiving the input signal from the registered buffer circuit, and operating in synchronization with the clock signal. Each of the plurality of semiconductor memory devices includes a memory cell array including a plurality of memory cells, a peripheral circuit for inputting/outputting of data to and from each of the plurality of memory cells, and a test mode circuit for generating a test mode signal for testing a special operation other than a normal operation based on a test mode shift signal received from the registered buffer circuit in the test mode. The peripheral circuit performs input/output of data for testing the special operation to and from each of the plurality of memory cells in accordance with the test mode signal.

In the semiconductor module according to the invention, when shifted to the test mode, the registered buffer circuit outputs the test mode shift signal to the semiconductor memory device, and the test mode circuit of the semiconductor memory device generates the test mode signal based on the test mode shift signal. In the semiconductor memory device, the special operation of the memory cell is tested.

According to the invention, therefore, the semiconductor memory device can be shifted to the test mode by using the test mode shift signal formed of the voltage level used in the semiconductor module.

Preferably, the test mode circuit generates the test mode signal based on a second test mode, shift signal different from a first test mode shift signal used for shifting the semiconductor memory device alone to the test mode.

When shifted to the test mode, the test mode circuit of the semiconductor memory device generates the test mode signal based on the test mode shift signal dedicated to the modular state. According to the invention, therefore, the semiconductor memory device can be shifted to the test mode in the module without applying a signal formed of a voltage level higher than a voltage level usually used in the semiconductor module.

Preferably, the test mode circuit generates the test mode signal based on a second test mode shift signal different from a first test mode shift signal used for shifting the semiconductor memory device to an individual device test mode.

When shifted to the test mode in the module, the second circuit in the test mode circuit operates, and the second circuit generates the test mode signal based on the test mode shift signal dedicated to the modular state. According to the invention, therefore, the circuit dedicated to the module can generates the test mode signal.

According to the invention, a semiconductor memory device for use in a semiconductor module operating in synchronization with a clock signal formed of a frequency achieving a second speed higher than a first speed and for shifting of semiconductor memory devices to an individual-device test mode, includes a memory cell array including a plurality of memory cells; a peripheral circuit for inputting/ outputting of data to and from each of the plurality of memory cells; and a test mode circuit for generating a test mode signal for testing a special operation different from a normal operation based on a test mode shift signal sent from a buffer circuit included in the semiconductor module when shifted to the test mode. The peripheral circuit performs input/output of data for testing the special operation of each of the plurality of memory cells in accordance with the test mode signal.

The semiconductor memory device according to the invention receives the test mode shift signal from the buffer circuit, which is a component of the semiconductor module, when shifted to the test mode. In the semiconductor memory device, the test mode circuit generates the test mode signal based on the test mode shift signal to test the special operation of the memory cell. According to the invention, therefore, the semiconductor memory device assembled in the semiconductor module can be shifted to the test mode.

Preferably, the test mode circuit is activated in one cycle of the clock signal to detect the test mode shift signal and generate the test mode signal in the subsequent cycle.

The activation of the test mode circuit and the detection of the test mode shift signal are performed in the two cycles of the clock signal. In the semiconductor module operating in synchronization with the clock signal of a high frequency, therefore, the semiconductor memory device can be shifted in synchronization with the clock signal. As a result, the semiconductor memory device can be used in the semiconductor module such that the semiconductor memory device in the module can be shifted to the test mode.

Preferably, the test mode circuit includes a detecting circuit being activated in the one cycle based on a predetermined signal sent from the buffer circuit to detect the test mode shift signal in the subsequent one cycle, and a signal generating circuit for generating the test mode signal in the subsequent one cycle when the detecting circuit detects the test mode shift signal.

When the test mode circuit is activated, the detection of the test mode shift signal and the generation of the test mode signal are performed within one cycle of the clock signal. According to the invention, therefore, the semiconductor memory device in the module can be rapidly shifted to the test mode.

Preferably, the detecting circuit includes a signal producing circuit for producing an activating signal in the one cycle based on the predetermined signal, and a comparing circuit being activated in the subsequent one cycle based on the activating signal to compare the voltage level of the test mode shift signal with the reference voltage level to output a result of the comparison in the subsequent one cycle, and the signal generating circuit generates the test mode signal when the voltage level of the test mode shift signal is higher than the reference voltage level.

When the activating signal is produced, the voltage level of the test mode shift signal is compared with the reference voltage level in one cycle of the clock signal, and the test mode signal is generated. According to the invention, therefore, the test mode shift signal of a level higher than the reference voltage level can be applied to the semiconductor memory device, whereby the semiconductor memory device can be rapidly shifted to the test mode in the module.

Preferably, the test mode circuit generates the test mode signal based on a second test mode shift signal different from a first test mode shift signal used for shifting the semiconductor memory device to an individual device test mode.

When shifted to the test mode, the test mode circuit of the semiconductor memory device generates the test mode signal based on the test mode shift signal dedicated to the modular state. According to the invention, therefore, the semiconductor memory device can be shifted to the test mode in the module without applying a signal formed of a voltage level higher than a voltage level usually used in the semiconductor module.

Preferably, the test mode circuit is formed of a first circuit for generating the test mode signal based on the first test mode shift signal, and a second circuit for generating the test mode signal based on the second test mode shift signal. The second circuit receives the second test mode shift signal from the buffer circuit.

When shifted to the test mode in the module, the second circuit in the test mode circuit operates, and the second circuit generates the test mode signal based on the test mode shift signal dedicated to the modular state. According to the invention, therefore, the circuit dedicated to the module can generates the test mode signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers, and description thereof is not repeated.

First Embodiment

Figure 1:
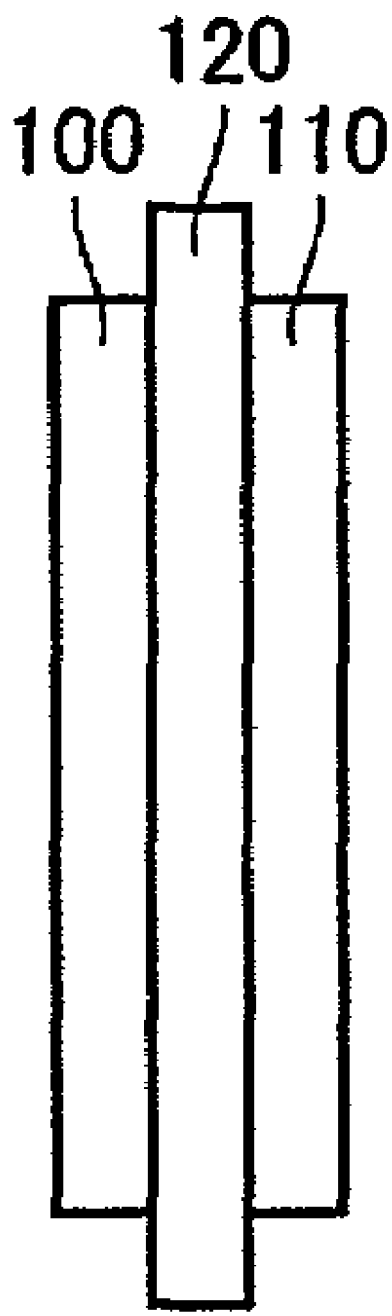
FIG. 1 is a cross section of a registered DIMM.

Referring to FIG. 1, a module 10 includes semiconductor modules 100 and 110, and a substrate 120. Semiconductor modules 100 and 110 are arranged on the opposite sides of substrate 120, respectively. Module 10 is an RDIMM, and semiconductor modules 100 and 110 include a plurality of DRAMs forming the RDIMM.

Figure 2:
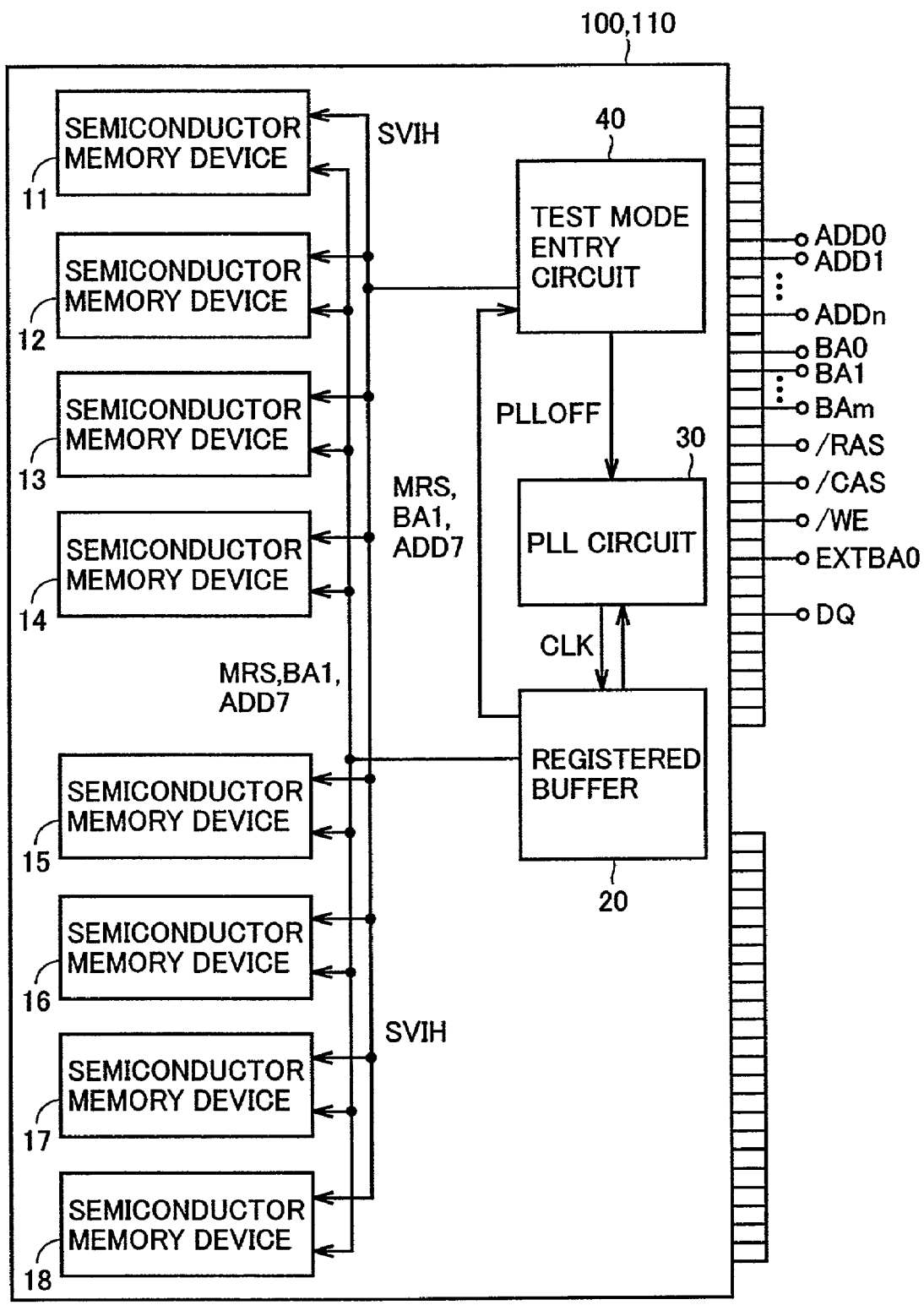
FIG. 2 is a schematic block diagram of a semiconductor module according to a first embodiment.

Referring to FIG. 2, each of semiconductor modules 100 and 110 according to the first embodiment includes semiconductor memory devices 11–18, a registered buffer 20, a PLL circuit 30 and a test mode entry circuit 40.

Each of semiconductor memory devices 11–18 is formed of a DRAM including a plurality of memory cells, and stores data. Registered buffer 20 receives address signals ADD0–ADDn, bank address signals BA0–BAm, row address strobe signal /RAS, column address strobe signal /CAS, write enable signal /WE and data from external terminals, and converts the received address signals ADD0–ADDn and others to predetermined voltage levels for use in semiconductor modules 100 and 110. Registered buffer 20 outputs address signals ADD0–ADDn and others at the predetermined converted voltage levels to semiconductor memory devices 11–18 in synchronization with a clock signal CLK sent from PLL circuit 30.

Registered buffer 20 performs the logical AND among the row address strobe signal /RAS, column address strobe signal /CAS and write enable signal /WE at the predetermined converted levels, and outputs the result of the logical AND as signal MRS to semiconductor memory devices 11–18 and test mode entry circuit 40.

Further, registered buffer 20 outputs address signal ADD7 and bank address signal BA1 at the predetermined converted levels to semiconductor memory devices 11–18 and test mode entry circuit 40.

Further, registered buffer 20 outputs the data, which is read from semiconductor memory devices 11–18, to an I/O terminal DQ.

PLL circuit 30 generates a clock signal CLK having a frequency of 50 MHz or more, and matches the phase of clock signal CLK thus generated with the phase of data sent from registered buffer 20. PLL circuit 30 outputs clock signal CLK having the adjusted phase to semiconductor memory devices 11–18 and registered buffer 20.

Test mode entry circuit 40 receives signal MRS, address signal ADD7 and bank address signal BA1 from registered buffer 20, and externally and directly receives signal EXTBA0. Test mode entry circuit 40 generates a signal PLLOFF and a signal SVIH in a method, which will be described later, based on signal MRS, signal EXTBA0, address signal ADD7 and bank address signal BA1, and outputs signal PLLOFF thus generated to PLL circuit 30. Test mode entry circuit 40 also outputs signal SVIH to semiconductor memory devices 11–18.

The operation speed of semiconductor modules 100 and 110 synchronized with clock signal CLK is higher than the speed in the case where each of semiconductor memory devices 11–18 is shifted to an individual device test mode. Semiconductor memory devices 11–18 operate in synchronization with clock signal CLK sent from PLL circuit 30 and, in semiconductor modules 100 and 110, operate at a higher speed than the semiconductor memory device used in an individual device test mode.

FIG. 2 does not show output lines for outputting clock signal CLK from PLL circuit 30 to semiconductor memory devices 11–18 as well as output lines for outputting the read data from semiconductor memory devices 11–18 to registered buffer 20 for simplicity reason.

Figure 3:
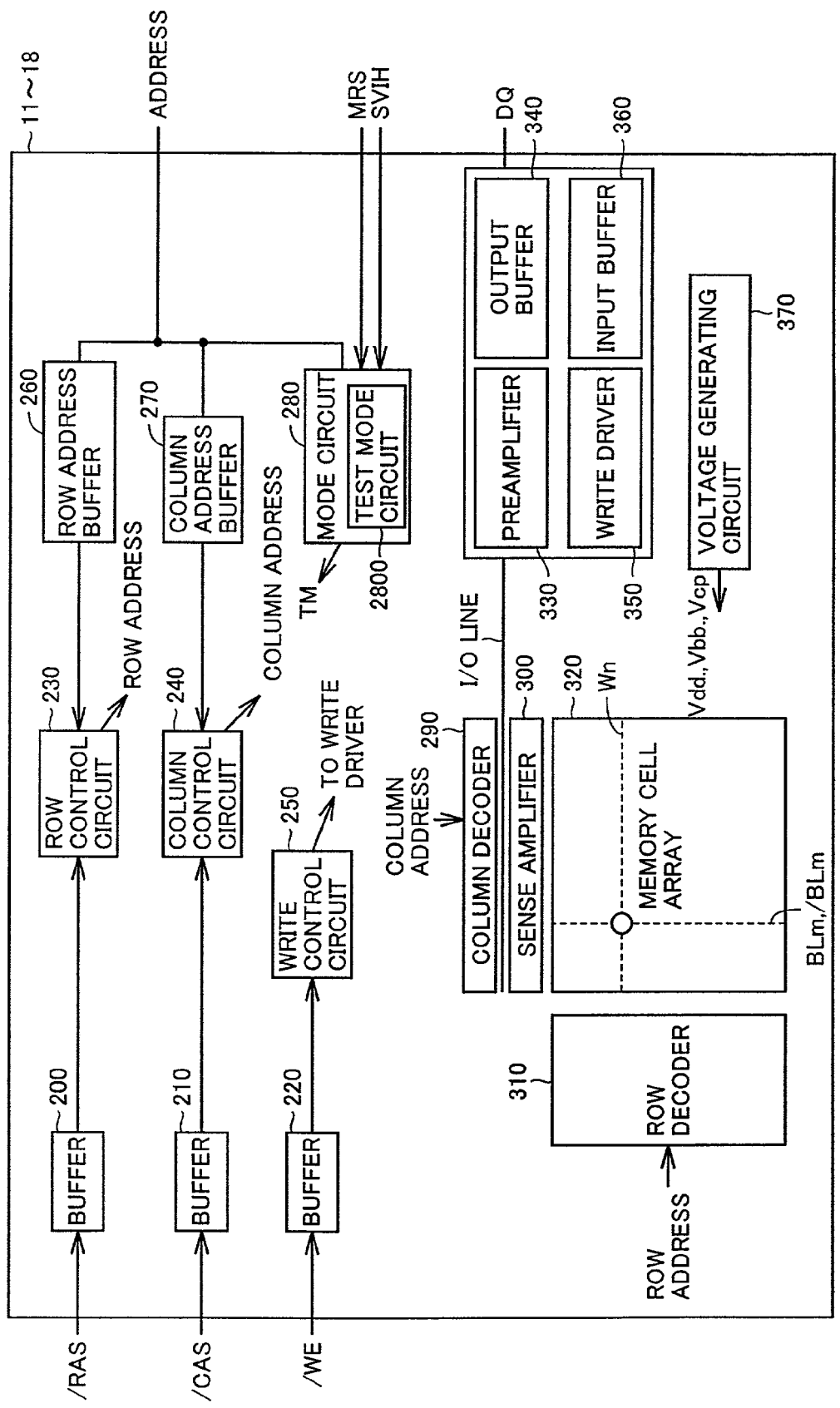
FIG. 3 is a schematic block diagram of a semiconductor memory device shown in FIG. 2.

Referring to FIG. 3, each of semiconductor memory devices 11–18 includes buffers 200, 210 and 220, a row control circuit 230, a column control circuit 240, a write control circuit 250, a row address buffer 260, a column address buffer 270, a mode circuit 280, a column decoder 290, a sense amplifier 300, a row decoder 310, a memory cell array 320, a preamplifier 330, an output buffer 340, a write driver 350, an input buffer 360 and a voltage generating circuit 370.

Buffer 200 latches row address strobe signal /RAS sent from registered buffer 20, and outputs the latched row address strobe signal /RAS to row control circuit 230. Buffer 210 latches column address strobe signal /CAS sent from registered buffer 20, and outputs latched column address strobe signal /CAS to column control circuit 240. Buffer 220 latches write enable signal /WE sent from registered buffer 20, and outputs latched write enable signal /WE to write control circuit 250.

Row address buffer 260 latches address signals ADD0–ADDn sent from registered buffer 20, and outputs latched address signals ADD0–ADDn to row control circuit 230.

Column address buffer 270 latches address signals ADD0–ADDn sent from registered buffer 20, and outputs latched address signals ADD0–ADDn to column control circuit 240.

As the row addresses, row control circuit 230 outputs address signals ADD0–ADDn, which are sent from row address buffer 260, to row decoder 310 in accordance with the timing of shifting of row address strobe signal /RAS sent from buffer 200 from H-level to L-level. As the column addresses, column control circuit 240 outputs address signals ADD0–ADDn, which are sent from column address buffer 270, to column decoder 290 in accordance with the timing of shifting of column address strobe signal /CAS sent from buffer 210 from H-level to L-level. Write control circuit 250 controls write driver 350 to write the write data onto the I/O line when it receives write enable signal /WE of L-level from buffer 220.

Mode circuit 280 includes a mode switch circuit (not shown) and a test mode circuit 2800. The mode switch circuit can select each of the plurality of banks forming memory cell array 320 based on bank addresses BA0-BAm sent from registered buffer 20. The structures of the banks, the manner of selecting the bank and others are not directly related to the invention, and therefore, the banks are not shown in FIG. 3.

Test mode circuit 2800 generates test mode signal TM in a method, which will be described later, based on signal MRS, address signal ADD7 and bank address signal BA1 sent from registered buffer 20 and signal SVIH sent from test mode entry circuit 40.

Column decoder 290 decodes the column address input from column control circuit 240, and activates bit line pair BLm and /BLm designated by the decoded column address. Sense amplifier 300 transfers the write data, which is written onto the I/O line by write driver 350, onto bit line pair BLm and /BLm thus activated. Sense amplifier 300 receives the read data, which is read from activated memory cell, via bit line pair BLm and /BLm, and amplifies the read data. Sense amplifier 300 outputs the amplified read data to preamplifier 330 via the I/O line.

Row decoder 310 decodes the row address sent from row control circuit 230, and activates word line Wn designated by the decoded row address. Memory cell array 320 includes a plurality of memory cells, a plurality of bit line pairs BLm and /BLm, a plurality of equalize circuits and a plurality of word lines Wn. The plurality of memory cells are arranged in n rows and m columns (n, m: natural numbers), and are selectively activated by the plurality of word lines Wn and the plurality of bit line pairs BLm and /BLm. The plurality of equalize circuits are provided corresponding to the plurality of bit line pairs BLm and /BLm, respectively, and equalize the corresponding bit line pairs BLm and /BLm to a precharge voltage Vbb before start of input/output of the data to or from the memory cells, respectively.

Preamplifier 330 amplifies the read data, which is input via the I/O line, and outputs the read data thus amplified to output buffer 340. Output buffer 340 latches the read data sent from preamplifier 330, and outputs the read data thus latched to registered buffer 20 via I/O terminal DQ.

Input buffer 360 latches the write data, which is input from registered buffer 20, and outputs the write data thus latched to write driver 350. Write driver 350 writes the write data, which is input from input buffer 360, onto the I/O line under control by write control circuit 250.

Voltage generating circuit 370 lowers the external power supply voltage to generate an array operation voltage Vdd, precharge voltage Vbb and a cell plate voltage Vcp, and supplies array operation voltage Vdd thus generated to sense amplifier 300. Also, voltage generating circuit 370 supplies precharge voltage Vbb thus generated to the plurality of equalize circuits included in memory cell array 320, and supplies cell plate voltage Vcp thus generated to cell plate electrodes of the memory cells. Array operation voltage Vdd is used as a power supply voltage for amplifying the read data by sense amplifier 300. Precharge voltage Vbb is used as a power supply voltage for equalizing bit line pair BLm and /BLm by the corresponding equalize circuit. Cell plate voltage Vcp is used for holding the data, which is written into the memory cell, in the memory cell.

Figure 4:
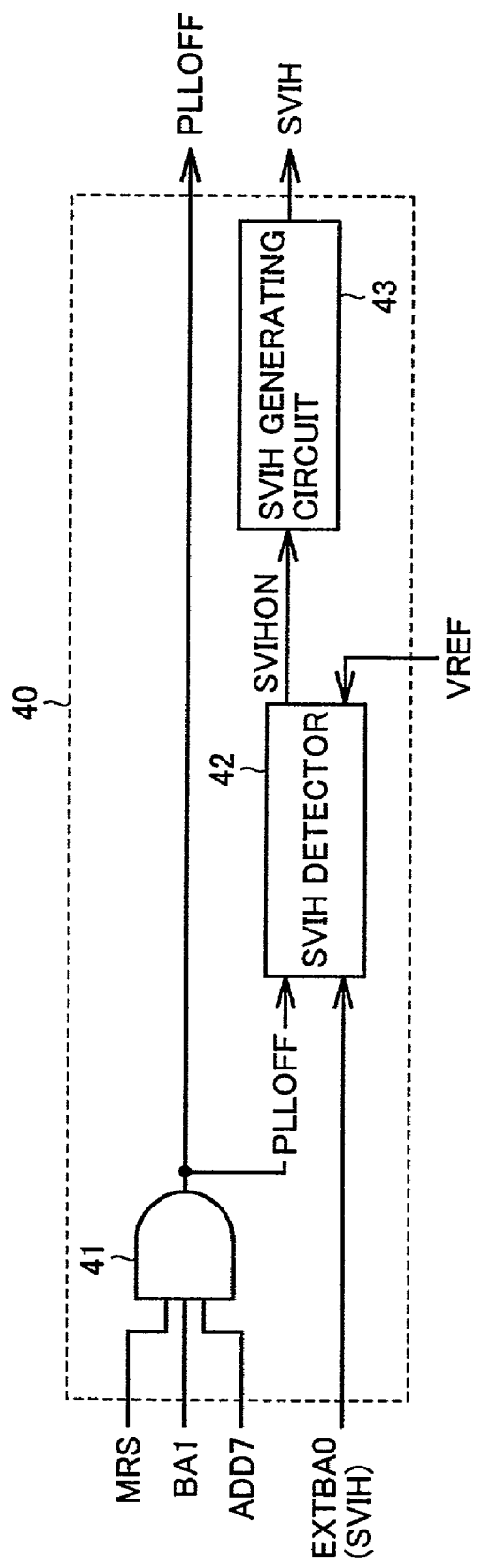
FIG. 4 is a circuit block diagram of a test mode entry circuit shown in FIG. 2.

Referring to FIG. 4, test mode entry circuit 40 includes an AND gate 41, an SVIH detector 42 and an SVIH generating circuit 43. AND gate 41 performs logical AND among signal MRS, address signal ADD7 and bank address signal BA1 sent from registered buffer 20 to generate signal PLLOFF, and sends signal PLLOFF thus generated to PLL circuit 30 and SVIH detector 42.

When semiconductor memory devices 11–18 are to be shifted to the test mode for testing a special operation, semiconductor modules 100 and 110 are supplied with row address strobe signal /RAS of L-level, column address strobe signal /CAS of L-level, write enable signal /WE of L-level, address signal ADD7 of H-level and bank address signal BA1 of H-level. Therefore, test mode entry circuit 40 receives signal MRS of H-level, address signal ADD7 of H-level and bank address signal BA1 of H-level from registered buffer 20. Accordingly, AND gate 41 generates signal PLLOFF of H-level. When signal PLLOFF is at H-level, it deactivates PLL circuit 30, and activates SVIH detector 42. When signal PLLOFF is at L-level, it activates PLL circuit 30, and deactivates SVIH detector 42.

SVIH detector 42 is activated by signal PLLOFF of H-level, and thereby compares the voltage level of signal EXTBA0, which is externally and directly supplied, with reference voltage level VREF. SVIH detector 42 outputs signal SVIHON of H-level to SVIH generating circuit 43 when the voltage level of signal EXTBA0 is higher than reference voltage level VREF. When the voltage level of signal EXTBA0 is lower than reference voltage level VREF, SVIH detector 42 outputs signal SVIHON of L-level to SVIH generating circuit 43.

When semiconductor memory devices 11–18 are to be shifted to the test mode, SVIH detector 42 outputs signal SVIHON of H-level to SVIH generating circuit 43 because signal EXTBA0 has a voltage level higher than the voltage level in the normal operating range.

When SVIH generating circuit 43 receives signal SVIHON of H-level, it generates signal SVIH of H-level, which is formed of a voltage level higher than the voltage level in the normal operating range, and outputs signal SVIH thus generated of H-level to semiconductor memory devices 11–18. When SVIH generating circuit 43 receives signal SVIHON of L-level, it generates signal SVIH of L-level formed of a voltage level lower than reference voltage level VREF, and outputs signal SVIH thus generated of L-level to semiconductor memory devices 11–18.

Figure 5:
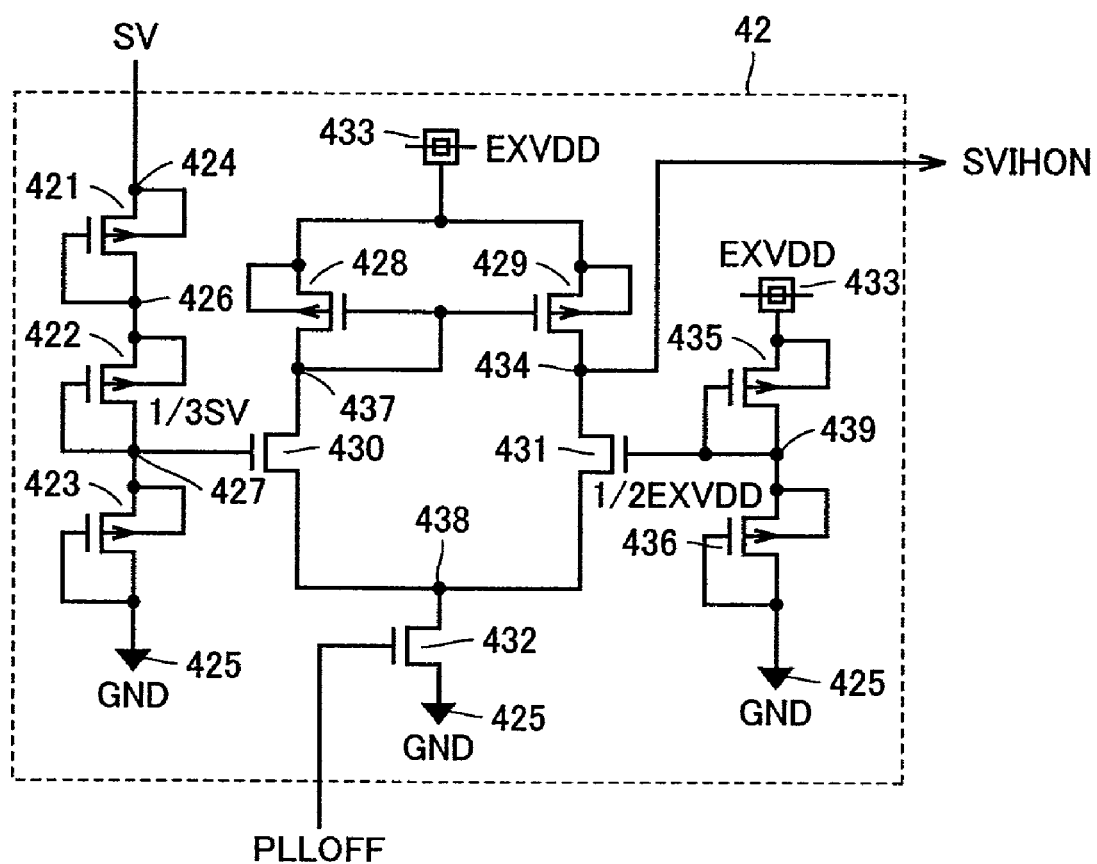
FIG. 5 is a circuit diagram of an SVIH detector shown in FIG. 4.

Referring to FIG. 5, SVIH detector 42 includes P-channel MOS transistors 421–423, 428, 429, 435 and 436 as well as N-channel MOS transistors 430–432.

P-channel MOS transistors 421–423 are connected in series between a node 424 and a ground node 425. P-channel MOS transistor 421 receives a voltage on node 424 as a substrate voltage, and is diode-connected between nodes 424 and 426. P-channel MOS transistor 422 receives a voltage on node 426 as the substrate voltage, and is diode-connected between nodes 426 and 427. P-channel MOS transistor 423 receives a voltage on node 427 as the substrate voltage, and is diode-connected between node 427 and ground node 425.

Therefore, each of P-channel MOS transistors 421–423 functions as a resistance, and divides the voltage level of a voltage SV supplied onto node 424 into trisections, and supplies the divided voltage ($\frac{1}{3}$)SV from node 427 to a gate terminal of N-channel MOS transistor 430.

P-channel MOS transistor 428 and N-channel MOS transistor 430 are connected in series between a power supply node 433 and a node 438. P-channel MOS transistor 429 and N-channel MOS transistor 431 are connected in series between power supply node 433 and node 438. P- and N-channel MOS transistors 428 and 430 are connected in parallel to P- and N-channel MOS transistors 429 and 431. A voltage on node 437 is supplied to gate terminals of P-channel MOS transistors 428 and 429. P-channel MOS transistors 428 and 429 receive, as their substrate voltages, power supply voltage EXVDD supplied to power supply node 433. N-channel MOS transistor 430 receives a voltage of ($\frac{1}{3}$)SV on its gate terminal, and N-channel MOS transistor 431 receives, as reference voltage VREF, voltage ($\frac{1}{2}$)EXVDD on its gate terminal. N-channel MOS transistor 432 is connected between a node 438 and ground node 425, and receives signal PLLOFF sent from test mode entry circuit 40 on its gate terminal.

P-channel MOS transistors 428 and 429 as well as N-channel MOS transistors 430 and 431 differentially compare voltage ($\frac{1}{3}$)SV supplied to the gate terminal of N-channel MOS transistor 430 with voltage ($\frac{1}{2}$)EXVDD supplied to the gate terminal of N-channel MOS transistor 431, and output signal SVIHON of H- or L-level corresponding to a result of the comparison. If the voltage level of voltage ($\frac{1}{3}$)SV is higher than the voltage level of voltage ($\frac{1}{2}$) EXVDD, the voltage on node 434 is higher than the voltage on node 437 so that SVIH detector 42 outputs signal SVIHON of H-level. If the voltage level of voltage ($\frac{1}{3}$)SV is lower than the voltage level of ($\frac{1}{2}$)EXVDD, the voltage on node 434 is lower than the voltage on node 437 so that SVIH detector 42 outputs signal SVIHON of L-level.

P-channel MOS transistors 435 and 436 are connected in series between power supply node 433 and ground node 425. P-channel MOS transistor 435 is diode-connected between power supply node 433 and a node 439, and receives, as its substrate voltage, power supply voltage EXVDD supplied to power supply node 433. P-channel MOS transistor 436 is diode-connected between node 439 and ground node 425, and receives the voltage on node 439 as the substrate voltage.

Accordingly, P-channel MOS transistors 435 and 436 divide power supply voltage EXVDD, which is supplied to power supply node 433, into halves, and the half voltage ($\frac{1}{2}$)EXVDD thus divided is supplied to the gate terminal of N-channel MOS transistor 431 as reference voltage level VREF.

When shifting semiconductor memory devices 11–18 to the test mode, signal PLLOFF of H-level is supplied through AND gate 41, and a voltage higher than (3/2)EXVDD forming signal EXTBA0 is externally and directly supplied as voltage SV. Therefore, the voltage level of voltage (1/3)SV is higher than the voltage level of voltage (1/2)EXVDD, and SVIH detector 42 outputs signal SVIHON of H-level. Further, in the normal operation, signal PLLOFF of L-level is supplied through AND gate 41 so that SVIH detector 42 is not activated, and outputs signal SVIHON of L-level.

Figure 6:
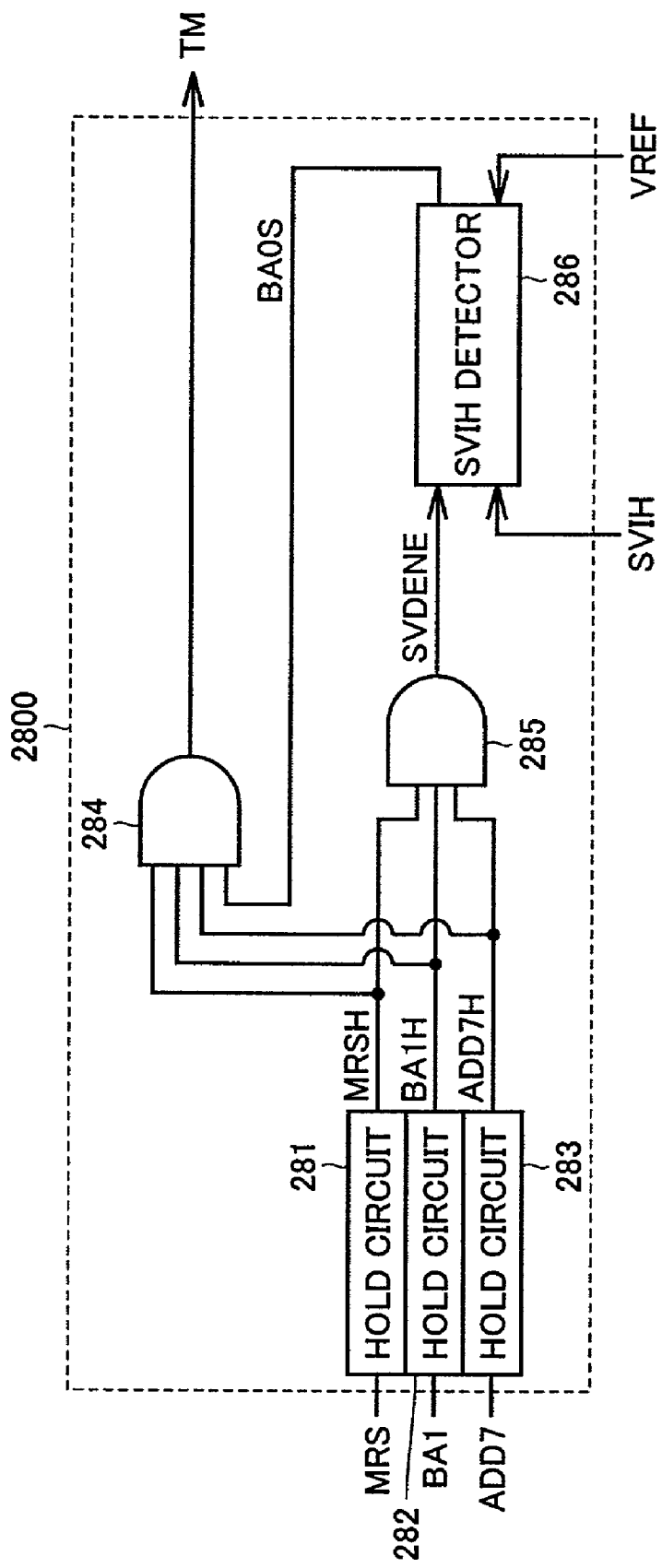
FIG. 6 is a circuit block diagram showing a test mode circuit included in a mode circuit shown in FIG. 3.
Figure 7:
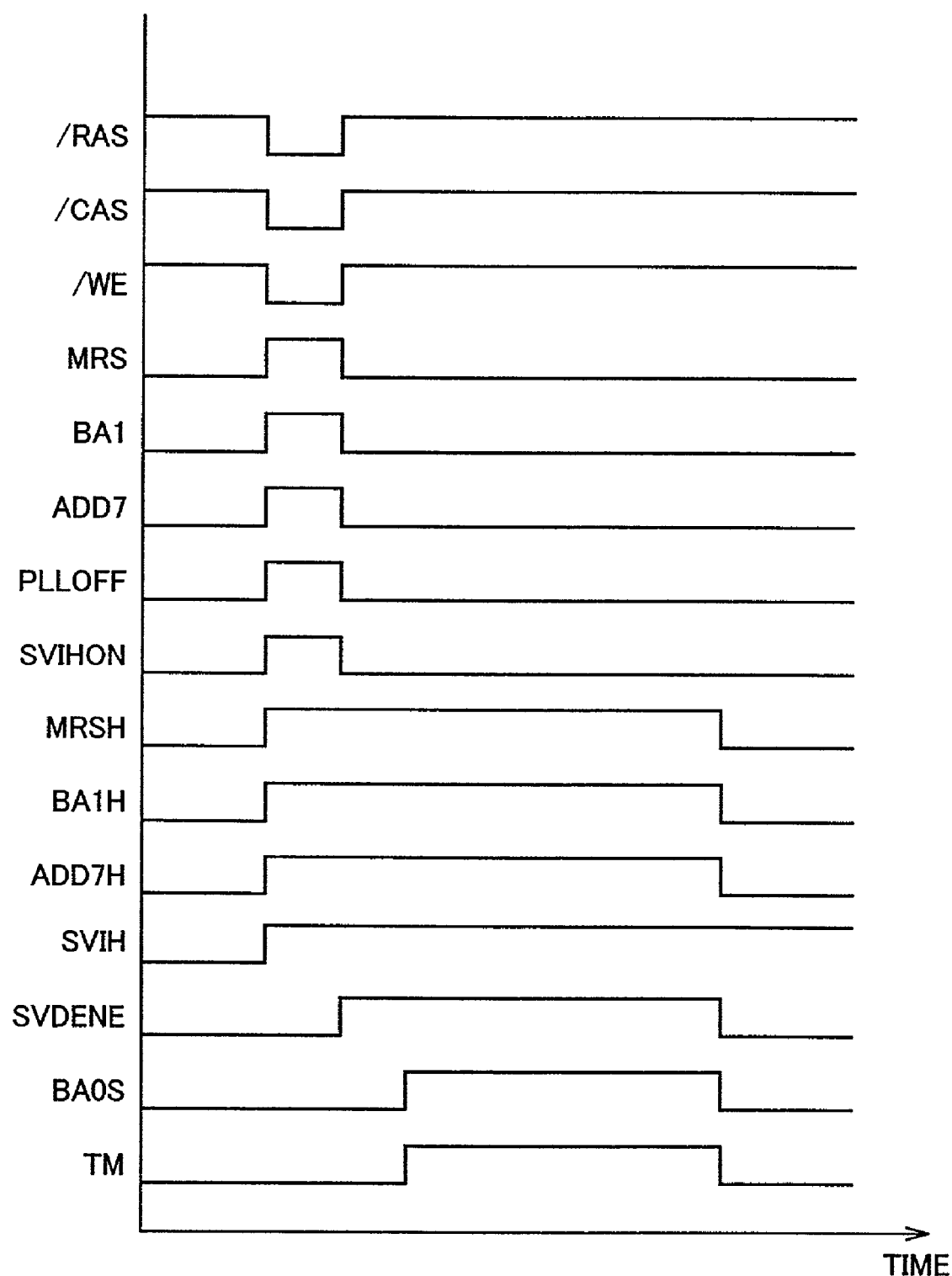
FIG. 7 is a timing chart showing signals in a shifting operation of the semiconductor memory device shown in FIG. 3 to a test mode.

Referring to FIG. 6, description will now be given on test mode circuit 2800 included in mode circuit 280 of each of semiconductor memory devices 11–18. Test mode circuit 2800 includes hold circuits 281–283, AND gates 284 and 285, and an SVIH detector 286.

Hold circuit 281 holds signal MRS, which is supplied from registered buffer 20, for a predetermined period, and outputs hold signal MRSH to AND gates 284 and 285. Hold circuit 282 holds bank address signal BA1, which is supplied from registered buffer 20, for a predetermined period, and outputs a hold signal BA1H to AND gates 284 and 285. Hold circuit 283 holds address signal ADD7, which is supplied from registered buffer 20, for a predetermined period, and outputs a hold signal ADD7H to AND gates 284 and 285.

AND gate 285 performs logical AND among hold signals MRSH, BA1H and ADD7H, and outputs a signal SVDENE, which is a result of the operation, to SVIH detector 286. SVIH detector 286 is formed of the same circuit structure as SVIH detector 42 shown in FIG. 5, and compares the voltage level of signal SVIH sent from SVIH generating circuit 43 with reference voltage level VREF for outputting signal BA0S, which is formed of the logical level corresponding to a result of this comparison, to AND gate 284. In this case, SVIH detector 286 receives, instead of signal PLLOFF, signal SVDENE as the activating signal on the gate terminal of N-channel MOS transistor 432.

AND gate 284 performs logical AND among hold signals MRSH, BA1H and ADD7H, and signal BA0S, and outputs test mode signal TM.

When semiconductor memory devices 11–18 are shifted to the test mode, signal MRS of H-level, bank address signal BA1 of H-level and address signal ADD7 of H-level are supplied from registered buffer 20, and signal SVIH, which is formed of the voltage level higher than the voltage level in the normal operating range, is supplied from test mode entry circuit 40. Thereby, hold circuit 281 outputs hold signal MRSH of H-level to AND gates 284 and 285, and hold circuit 282 outputs hold signal BA1H of H-level to AND gates 284 and 285. Hold circuit 283 outputs hold signal ADD7H of H-level to AND gates 284 and 285. AND gate 285 outputs signal SVDENE of H-level to SVIH detector 286 based on hold signals MRSH, BA1H and ADD7H of H-level. SVIH detector 286 is activated by signal SVDENE of H-level to compare the voltage level of signal SVIH with reference voltage level VREF, and output signal BA0S of H-level to AND gate 284. AND gate 284 outputs test mode signal TM of H-level based on hold signals MRSH, BA1H and ADD7H of H-level and signal BA0S of H-level.

Referring to FIGS. 2–7, description will now be given on the operation of shifting semiconductor memory devices 11–18 to the test mode in semiconductor modules 100 and 110. For shifting semiconductor memory devices 11–18 to the test mode, row address strobe signal /RAS of L-level, column address strobe signal /CAS of L-level, write enable signal /WE of L-level, bank address signal BA1 of H-level and address signal ADD7 of H-level are supplied from the external terminals, and signal EXTBA0, which is formed of the voltage level higher than the voltage level in the normal operating range, is directly supplied to test mode entry circuit 40.

Thereby, registered buffer 20 performs the logical AND among row address strobe signal /RAS of L-level, column address strobe signal /CAS of L-level and write enable signal /WE of L-level, and outputs signal MRS of H-level, which is a result of this logical AND, to semiconductor memory devices 11–18 and test mode entry circuit 40 in synchronization with clock signal CLK. Registered buffer 20 converts bank address signal BA1 of H-level and address signal ADD7 of H-level into bank address signal BA1 of H-level with the predetermined voltage level and address signal ADD7 of H-level with the predetermined voltage level, and then outputs bank address signal BA1 of H-level and address signal ADD7 of H-level to semiconductor memory devices 11–18 and test mode entry circuit 40 in synchronization with clock signal CLK.

In test mode entry circuit 40, AND gate 41 performs the logical AND among signal MRS of H-level, bank address signal BA1 of H-level, address signal ADD7 of H-level to output signal PLLOFF of H-level to SVIH detector 42 and PLL circuit 30. SVIH detector 42 is activated by signal PLLOFF of H-level to compare the voltage level of signal EXTBA0, which is formed of the voltage level higher than the voltage level in the normal operating range, with reference voltage level VREF, and output signal SVIHON of H-level to SVIH generating circuit 43. SVIH generating circuit 43 generates signal SVIH, which is formed of the high voltage level higher than the voltage level in the normal operating range, based on signal SVIHON of H-level, and outputs the signal SVIH to semiconductor memory devices 11–18. Thus, in the first embodiment, semiconductor modules 100 and 110 internally generate signal SVIH, which is formed of the high voltage level higher than the voltage level in the normal operating range.

Thereby, PLL circuit 30 is deactivated by signal PLLOFF of H-level, and semiconductor memory devices 11–18 are released from the operation state synchronized with clock signal CLK, which has the frequency of 50 MHz or more, and can operate at a lower speed.

In semiconductor memory devices 11–18, test mode circuit 2800 included in mode circuit 280 receives signal MRS of H-level, bank address signal BA1 of H-level and address signal ADD7 of H-level from registered buffer 20, and receives signal SVIH formed of the high voltage level from test mode entry circuit 40. In test mode circuit 2800, hold circuit 281 holds signal MRS of H-level, and outputs hold signal MRSH to AND gates 284 and 285. Hold circuit 282 holds bank address signal BA1 of H-level, and outputs hold signal BA1H to AND gates 284 and 285. Hold circuit 283 holds address signal ADD7 of H-level, and outputs hold signal ADD7H to AND gates 284 and 285.

AND gate 285 performs the logical AND among hold signals MRSH, BA1H and ADD7H of H-level to output signal SVDENE of H-level to SVIH detector 286. SVIH detector 286 is activated by signal SVDENE of H-level to compare the voltage level of signal SVIH with reference voltage level VREF, and output signal BA0S of H-level to AND gate 284.

Thereby, AND gate 284 performs the logical AND among hold signals MRSH, BA1H and ADD7H of H-level and signal BA0S of H-level, and outputs test mode signal TM of H-level. Thereby, each of semiconductor memory devices 11–18 is shifted to the test mode.

When shifting to the test mode, PLL circuit 30 is deactivated, and signal SVIH, which is formed of the high voltage level and is generated within semiconductor modules 100 and 110, is output to semiconductor memory devices 11–18. Therefore, semiconductor memory devices 11–18 are released from the operation synchronized with clock signal CLK having the frequency of 50 MHz or more, and test mode circuit 2800 can detect signal SVIH formed of the high voltage level independently of the frequency of clock signal CLK, and can generate test mode signal TM.

In this case, SVIH detector 286 receives signal SVIH of H-level before receiving signal SVDENE of H-level so that it starts the operation of detecting signal SVIH simultaneously with input of signal SVDENE of H-level from AND gate 285. Therefore, test mode circuit 2800 can generate test mode signal TM more rapidly than the prior art.

Semiconductor memory devices 11–18 shift to the test mode in accordance with the foregoing operations, and then address signals ADD0–ADDn and the data are supplied through the external terminals for performing the test of the special operation. Input/output of data to and from the plurality of memory cells included in memory cell array 320 are performed in a known manner, and therefore the operation for them is not described.

According to the first embodiment, the semiconductor module includes the plurality of semiconductor memory devices assembled therein, and operates in synchronization with the clock signal having the high frequency of 50 MHz or more. In this semiconductor module, the PLL circuit for generating the clock signal is deactivated when shifting to the test mode, and the signal, which is formed of the voltage level higher than the voltage level in the normal operating range, is internally generated for application to the semiconductor memory devices. Therefore, each of the plurality of semiconductor memory devices can be shifted to the test mode for testing the special operation in the state where each semiconductor memory device is assembled in the semiconductor module.

Second Embodiment

Figure 8:
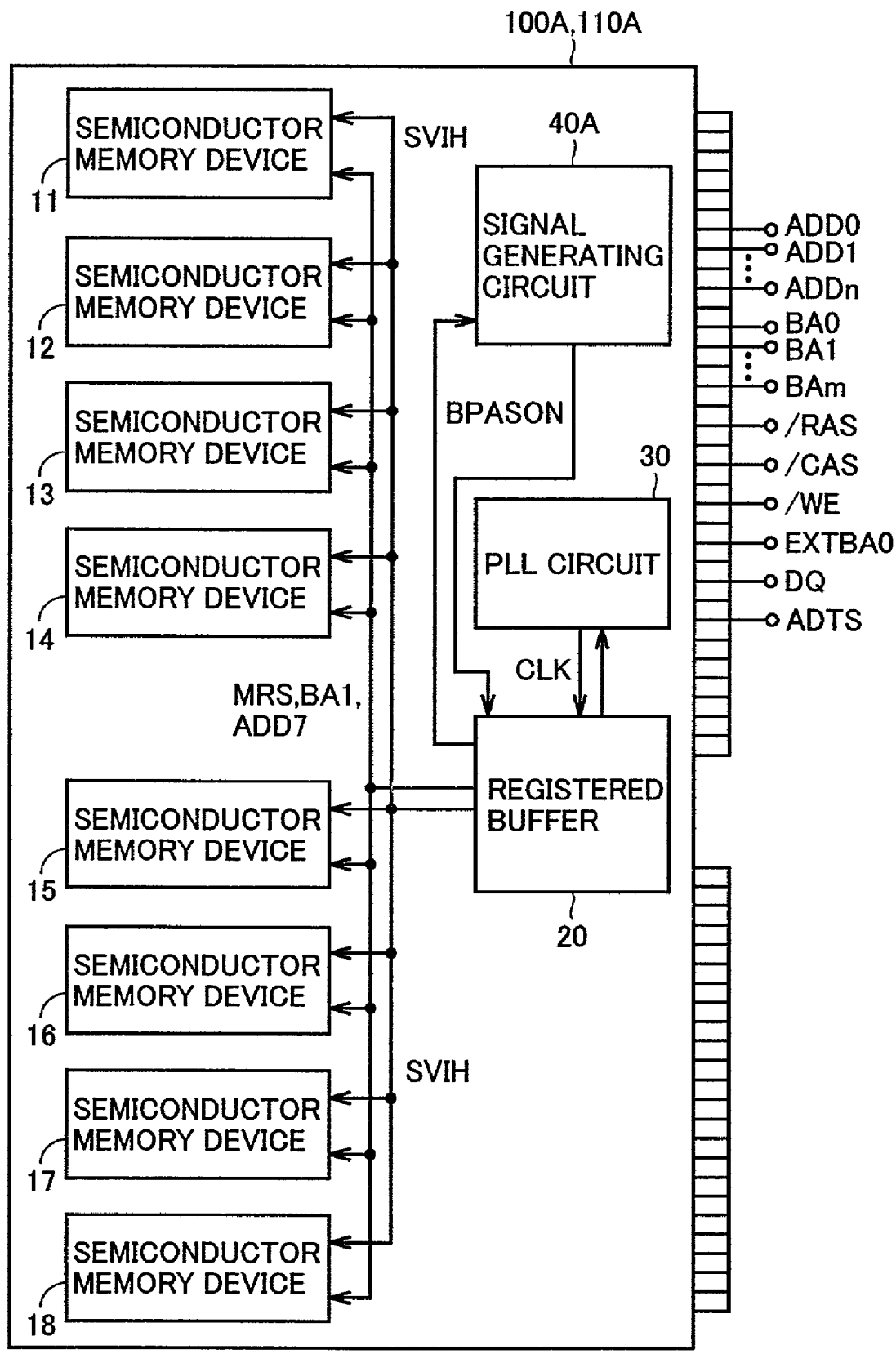
FIG. 8 is a schematic block diagram of a semiconductor module according to a second embodiment.

Referring to FIG. 8, semiconductor modules 100A and 110A of a second embodiment differ from semiconductor modules 100 and 110 of the first embodiment in that a signal generating circuit 40A is employed instead of test mode entry circuit 40. The structures other than the above are the same. However, registered buffer 20 has the same function as that in the first embodiment, and additionally has a function of directly supplying signal EXTBA0, which is formed of the voltage level higher than the voltage level in the normal operating range, to semiconductor memory devices 11–18 without converting signal EXTBA0 to the voltage level for use in the module. Semiconductor modules 100A and 110A are used in module 10 instead of semiconductor modules 100 and 110 shown in FIG. 1, and form the RDIMM.

Figure 9:
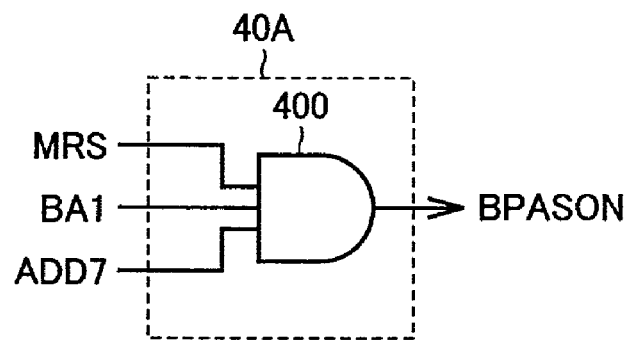
FIG. 9 is a circuit diagram showing a signal generating circuit shown in FIG. 8.

Referring to FIG. 9, signal generating circuit 40A is formed of an AND gate 400. AND gate 400 performs the logical AND among signal MRS, bank address signal BA1 and address signal ADD7 supplied from registered buffer 20, and outputs a result of the AND operation as a signal BPASON to registered buffer 20.

Figure 10:
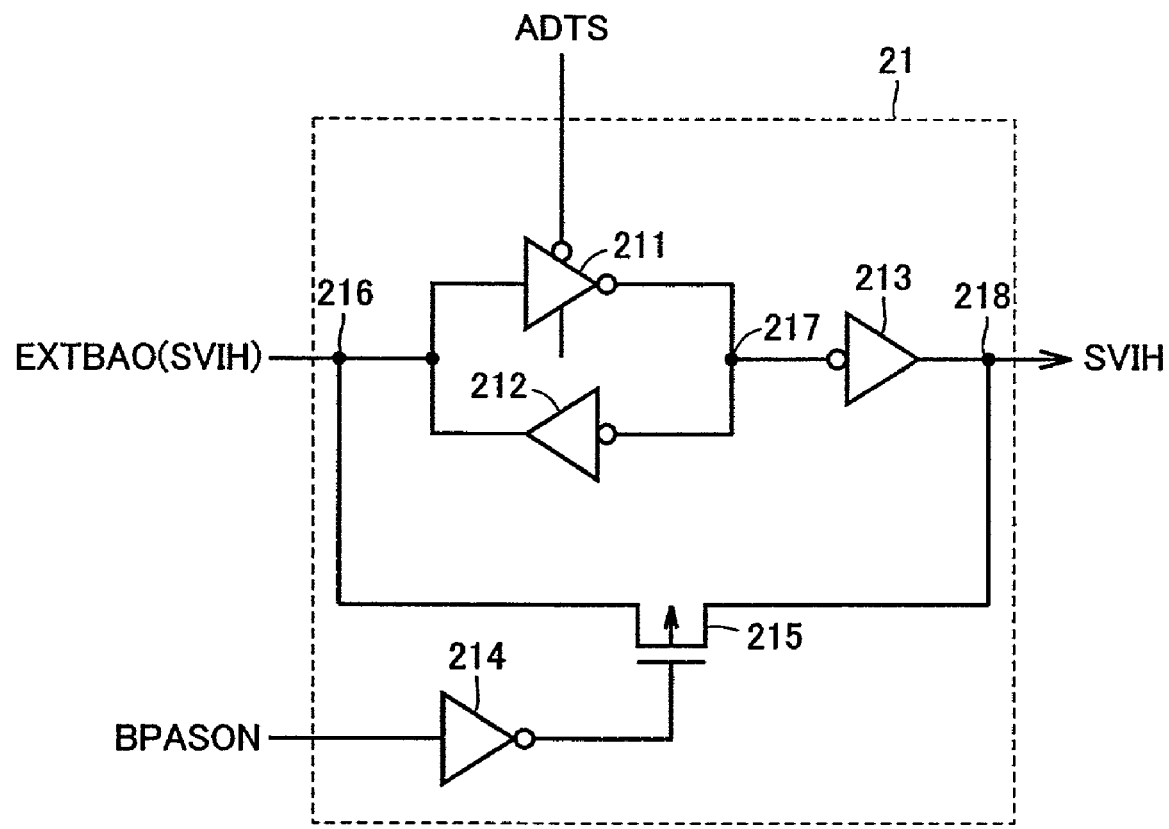
FIG. 10 is a circuit diagram showing a circuit included in a registered buffer circuit shown in FIG. 8.
Figure 11:
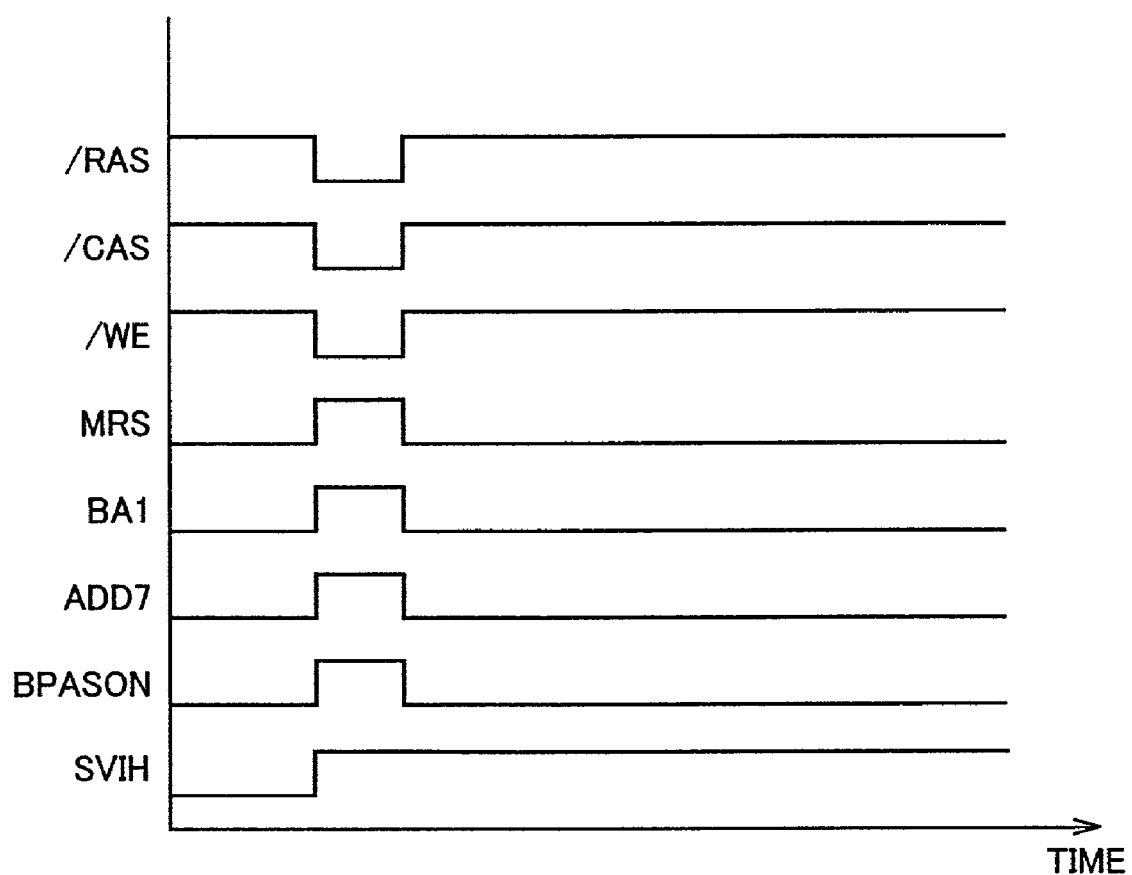
FIG. 11 is a timing chart showing signals in a shift operation of the semiconductor memory device shown in FIG. 8 to the test mode.

Referring to FIG. 10, registered buffer 20 includes a circuit 21. Circuit 21 is formed of inverters 211–214 and a P-channel MOS transistor 215. Inverters 211 and 212 are connected in parallel between nodes 216 and 217, and form a latch circuit. Inverter 213 is connected between nodes 217 and 218. P-channel MOS transistor 215 is connected between nodes 216 and 218. Inverter 211 is activated to invert the logical level of signal EXTBA0 when address shift allowing signal ADTS of L-level is input. Inverter 212 inverts the logical level of signal on node 217, and outputs it to node 216. Inverter 213 inverts the logical level of signal on node 217, and outputs it to node 218.

Therefore, the latch circuit formed of inverters 211 and 212 outputs the signal of L-level formed of the ground voltage to node 217 when it receives signal EXTBA0 of H-level formed of the high voltage level higher than the voltage level in the normal operating range. Inverter 213 outputs the signal of H-level formed of the power supply voltage supplied thereto. Inverter 213 is supplied with the power supply voltage formed of the voltage level, which is used in semiconductor modules 100A and 110A. Therefore, even in the case where it externally receives signal EXTBA0, which is formed of the voltage level higher than the voltage level in the normal operating range, the voltage level of signal EXTBA0 is converted to the voltage level of the power supply voltage supplied to inverter 213 when P-channel MOS transistor 215 is off.

Inverter 214 inverts signal BPASON sent from signal generating circuit 40A, and outputs it to the gate terminal of P-channel MOS transistor 215. Therefore, when inverter 214 receives signal BPASON of H-level from signal generating circuit 40A, inverter 214 outputs the signal of L-level to the gate terminal of P-channel MOS transistor 215 so that P-channel MOS transistor 215 is turned on.

When semiconductor memory devices 11–18 are shifted to the test mode, address shift allowing signal ADTS of H-level is externally input, and signal BPASON of H-level is input from signal generating circuit 40A. Therefore, inverter 211 is deactivated, and P-channel MOS transistor 215 is turned on. As a result, signal EXTBA0 is supplied to node 218 via P-channel MOS transistor 215 while holding the high voltage level.

When semiconductor memory devices 11–18 are not to be shifted to the test mode, address shift allowing signal ADTS of L-level is externally input, and signal BPASON of L-level is input from signal generating circuit 40A. Therefore, inverter 211 is activated and P-channel MOS transistor 215 is turned off. As a result, inverters 211–213 convert the voltage level of signal EXTBA0 to the voltage level to be used within semiconductor modules 100 and 110, and supply the converted signal to node 218. Inverter 214 and P-channel MOS transistor 215 form a bypass circuit.

Referring to FIGS. 8–11, description will now be given on the operation of shifting semiconductor memory devices 11–18 in semiconductor modules 100A and 110A to the test mode. Row address strobe signal /RAS of L-level, column address strobe signal /CAS of L-level, write enable signal /WE of L-level, bank address signal BA1 of H-level and address signal ADD7 of H-level are externally input. Thereafter, registered buffer 20 outputs signal MRS of H-level, bank address signal BA1 of H-level and address signal ADD7 of H-level to semiconductor memory devices 11–18 and signal generating circuit 40A. The above operation of externally inputting the signals and the above signal output operation of registered buffer 20 as well as the operations between these operations are the same as those in the first embodiment already described.

In the second embodiment, when shifting semiconductor memory devices 11–18 to the test mode, such an operation is further performed that registered buffer 20 is externally supplied with address shift allowing signal ADTS of H-level and signal EXTBA0, which is formed of the high voltage level higher than the voltage level in the normal operating range.

When signal MRS of H-level, bank address signal BA1 of H-level and address signal ADD7 of H-level are input, signal generating circuit 40A generates signal BPASON of H-level, and signal BPASON thus generated of H-level is output to registered buffer 20.

Thereby, circuit 21 included in registered buffer 20 operates such that inverter 211 is deactivated, and inverter 214 outputs the signal of L-level, which is prepared by inverting signal BPASON of H-level, to the gate terminal of P-channel MOS transistor 215. P-channel MOS transistor 215 is turned on, and signal EXTBA0 formed of the high voltage level is supplied to node 218 while holding its voltage level. Registered buffer 20 outputs signal SVIH formed of the high voltage level to semiconductor memory devices 11–18.

In the second embodiment, semiconductor memory devices 11–18 are supplied with signal MRS of H-level, bank address signal BA1 of H-level, address signal ADD7 of H-level and signal SVIH formed of the high voltage level. Therefore, test mode circuit 2800 in each of semiconductor memory devices 11–18 shifts to the test mode in the same manner as the first embodiment.

In the second embodiment, PLL circuit 30 is not deactivated, but circuit 21 included in registered buffer 20 outputs signal SVIH formed of the high voltage level to test mode circuit 2800 of each of semiconductor memory devices 11–18 when signal BPASON attains H-level. Therefore, test mode circuit 2800 can operate to detect signal SVIH and generate test mode signal TM within one cycle of clock signal CLK has the frequency of 50 MHz or more. Therefore, even in the case where semiconductor memory devices 11–18 operate in synchronization with clock signal CLK having the high frequency of 50 MHz or more, semiconductor memory devices 11–18 assembled in the module can be shifted to the test mode.

Structures and operations other than the above are the same as those of the first embodiment.

In the second embodiment, signal generating circuit 40A and circuit 21 included in registered buffer 20 form the test mode entry circuit.

According to the second embodiment, the semiconductor module includes the test mode entry circuit for directly supplying the signal, which is externally supplied and is formed of the voltage level higher than the voltage level in the normal operating range, to the semiconductor memory devices when shifting to the test mode. Therefore, the semiconductor memory device can be shifted to the test mode in the state where it is assembled in the module.

Third Embodiment

Figure 12:
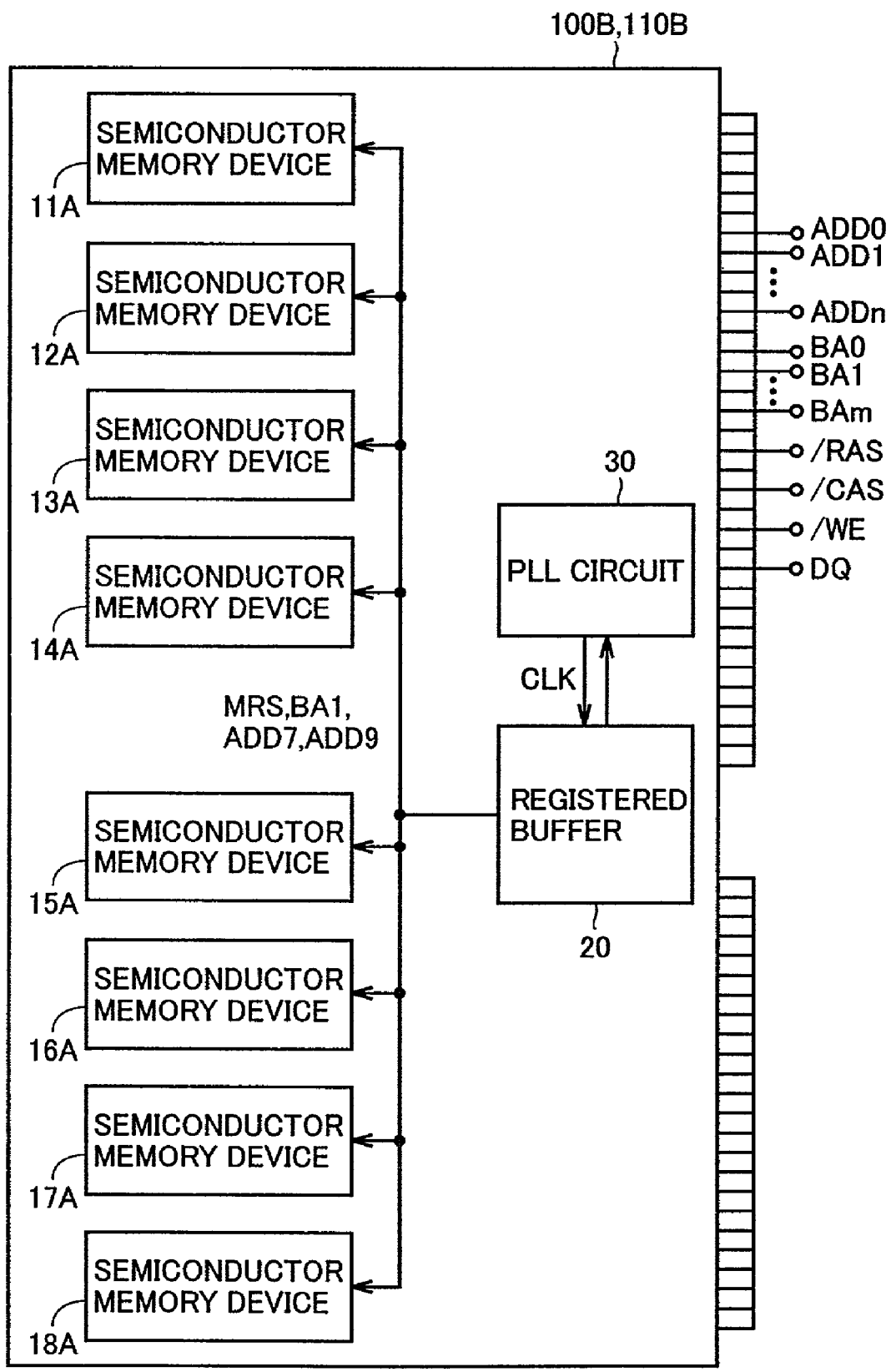
FIG. 12 is a schematic block diagram of a semiconductor module according to a third embodiment.

Referring to FIG. 12, semiconductor modules 100B and 110B according to a third embodiment differ from semiconductor modules 100 and 110 in that test mode entry circuit 40 is not employed, and semiconductor memory devices 11A–18A are employed instead of semiconductor memory devices 11–18. Structures other than the above are the same as those of semiconductor modules 100 and 110. However, semiconductor modules 100B and 110B are not externally supplied with signal EXTBA0 formed of a high voltage level. When shifting to the test mode, registered buffer 20 outputs an address signal ADD9 to semiconductor memory devices 11A–18A in addition to signal MRS, bank address signal BA1 and address signal ADD7. Semiconductor modules 100B and 110B are used in module 10 instead of semiconductor modules 100 and 110 shown in FIG. 1, and form the RDIMM.

Figure 13:
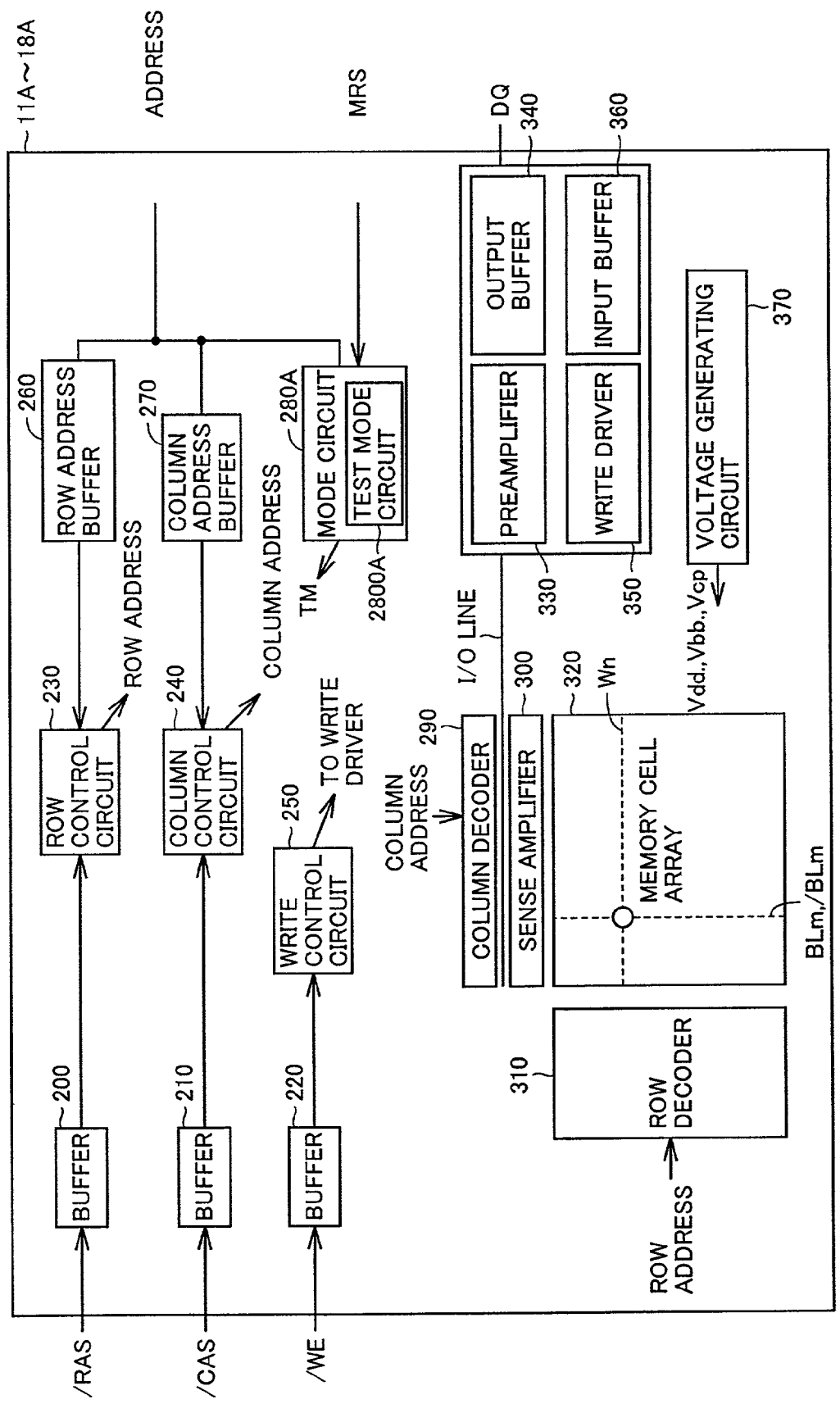
FIG. 13 is a schematic block diagram of a semiconductor memory device shown in FIG. 12.

Referring to FIG. 13, semiconductor memory devices 11A–18A differ from semiconductor memory devices 11–18 in that mode circuit 280 is replaced with a mode circuit 280A. Structures other than the above are the same as those in semiconductor memory devices 11–18. Mode circuit 280A includes a test mode circuit 2800A instead of test mode circuit 2800.

Figure 14:
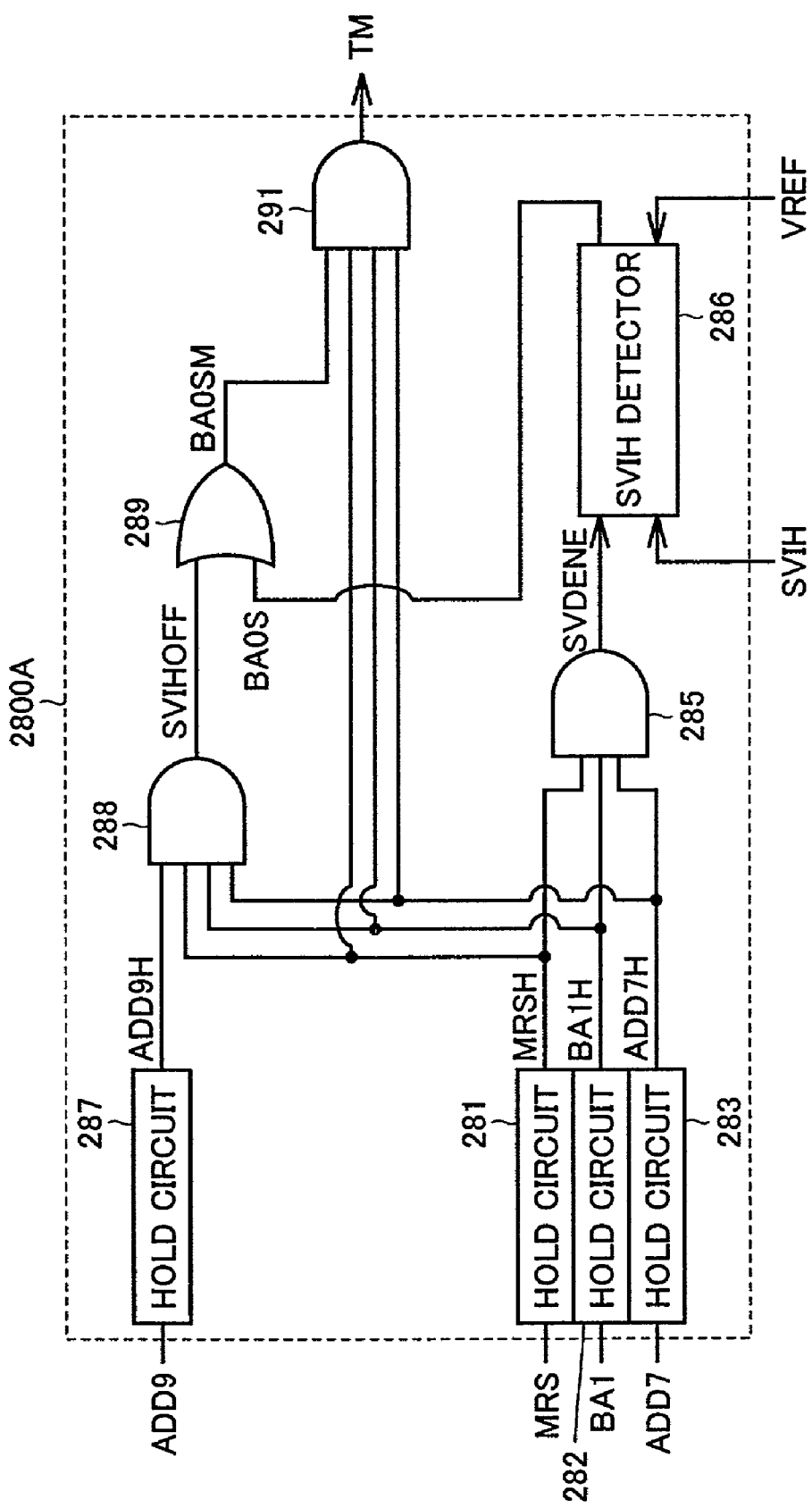
FIG. 14 is a circuit block diagram of a test mode circuit included in a mode circuit shown in FIG. 13.
Figure 15:
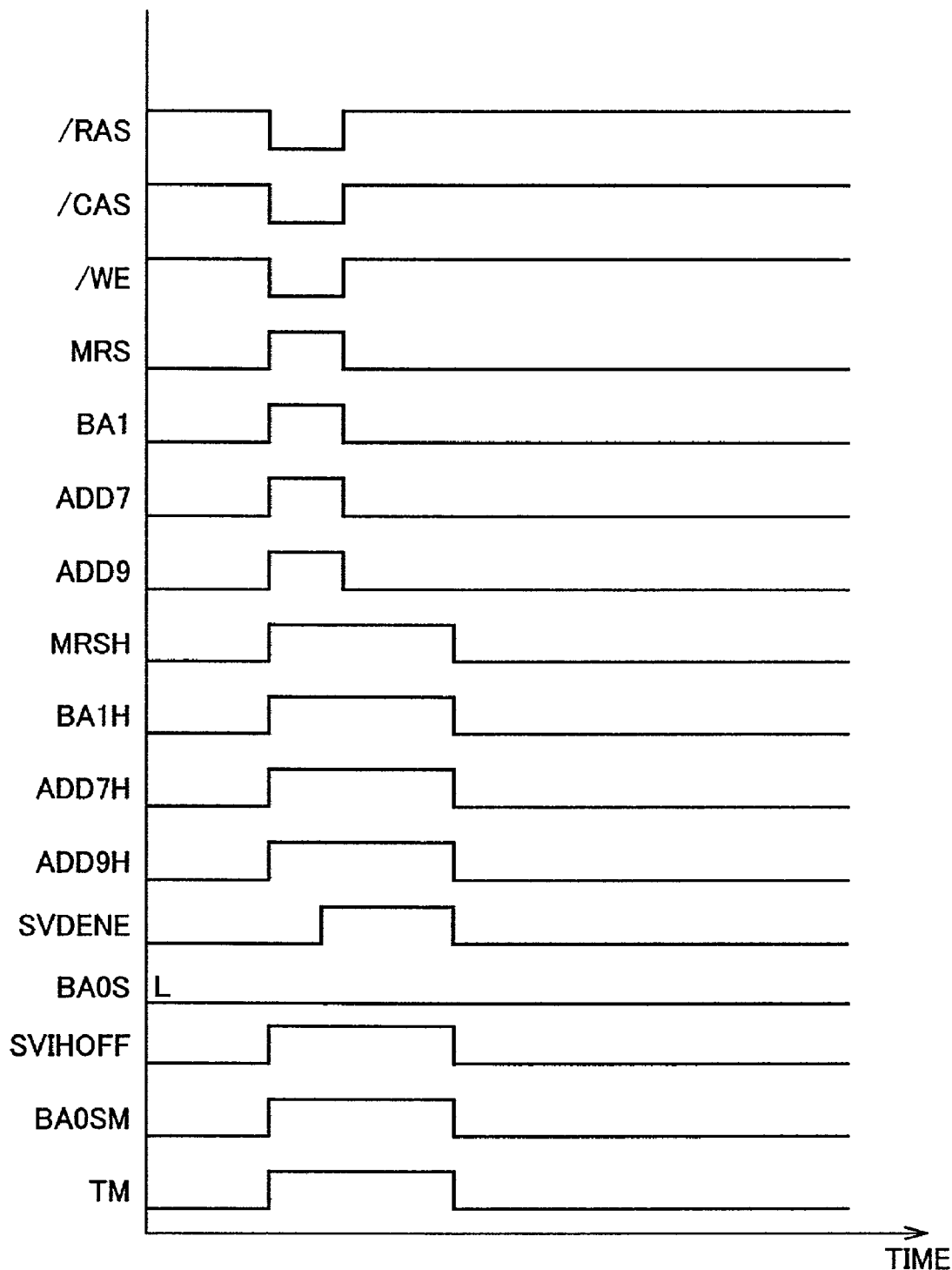
FIG. 15 is a timing chart showing signals in a shift operation of the semiconductor memory device shown in FIG. 13 to the test mode.

Referring to FIG. 14, test mode circuit 2800A is not provided with AND gate 284 employed in test mode circuit 2800, and is additionally provided with a hold circuit 287, AND gates 288 and 291, and an OR gate 289. Structures other than the above are the same as those of test mode circuit 2800.

In test mode circuit 2800A, hold circuits 281–283 output hold signals MRSH, BA1H and ADD7H held thereby to AND gates 285, 288 and 291. SVIH detector 286 outputs signal BA0S to OR gate 289.

Hold circuit 287 holds address signal ADD9, which is input from registered buffer 20, for a predetermined period, and outputs a hold signal ADD9H to AND gate 288. AND gate 288 performs the logical AND among four hold signals MRSH, BA1H, ADD7H and ADD9H, and outputs a result of the operation as a signal SVIHOFF to OR gate 289. OR gate 289 performs the logical OR between signal SVIHOFF and signal BA0S, and outputs a result of the operation as signal BA0SM to AND gate 291. AND gate 291 performs the logical AND among three hold signals MRSH, BA1H and ADD7H and signal BA0SM, and outputs test mode signal TM.

In the third embodiment, signal SVIH formed of the voltage level higher than the voltage level in the normal operating range is not supplied to semiconductor memory devices 11A–18A. Therefore, SVIH detector 286 receives a voltage lower than reference voltage level VREF. Therefore, regardless of whether the shift request for the test mode is present or not, SVIH detector 286 outputs signal BA0S of L-level to OR gate 289.

When semiconductor memory devices 11A–18A are shifted to the test mode, row address strobe signal /RAS of L-level, column address strobe signal /CAS of L-level, write enable signal /WE of L-level, bank address signal BA1 of H-level and address signals ADD7 and ADD9 of H-level are externally supplied so that registered buffer 20 outputs signal MRS of H-level, bank address signal BA1 of H-level and address signals ADD7 and ADD9 of H-level to semiconductor memory devices 11A–18A.

Therefore, hold circuit 281 outputs hold signal MRSH of H-level to AND gates 285, 288 and 291, and hold circuit 282 outputs hold signal BA1H of H-level to AND gates 285, 288 and 291. Hold circuit 283 outputs hold signal ADD7H of H-level to AND gates 285, 288 and 291, and hold circuit 287 outputs hold signal ADD9H of H-level to AND gate 288.

Thereby, AND gate 285 performs the logical AND among hold signals MRSH, BA1H and ADD7H of H-level, and outputs signal SVDENE of H-level to SVIH detector 286. SVIH detector 286 is activated by signal SVDENE of H-level, and is always supplied with the voltage lower than reference voltage level VREF as already described so that signal BA0S of L-level is output to OR gate 289.

AND gate 288 performs the logical AND among hold signals MRSH, BA1H, ADD7H and ADD9H of H-level, and outputs signal SVIHOFF of H-level to OR gate 289. OR gate 289 performs the logical OR between signal SVIHOFF of H-level and signal BA0S of L-level, and outputs signal BA0SM of H-level to AND gate 291. Thereby, AND gate 291 performs the logical AND among hold signal MRSH of H-level, hold signal BA1H of H-level, hold signal ADD7H of H-level and signal BA0SM of H-level, and outputs test mode signal TM of H-level.

When SVIH detector 286 outputs signal BA0S of H-level, or when AND gate 288 outputs signal SVIHOFF of H-level, test mode circuit 2800A outputs test mode signal TM of H-level. Therefore, when signal MRS of H-level, bank address signal BA1 of H-level, address signal ADD7 of H-level and signal SVIH formed of the voltage level higher than the voltage level in the normal operating range are input, test mode circuit 2800A outputs test mode signal TM of H-level by hold circuits 281–283, AND gate 285, SVIH detector 286, OR gate 289 and AND gate 291. When signal MRS of H-level, bank address signal BA1 of H-level and address signals ADD7 and ADD9 of H-level are input, test mode circuit 2800A outputs test mode signal TM of H-level by hold circuits 281–283 and 287, AND gate 288, OR gate 289 and AND gate 291.

Signal MRS of H-level, bank address signal BA1 of H-level, address signal ADD7 of H-level and signal SVIH formed of the voltage level higher than the voltage level in the normal operating range are signals, which are input when test mode circuit 2800 in the first embodiment generates test mode signal TM of H-level. Therefore, assuming that a first test mode shift signal is formed of signal MRS of H-level, bank address signal BA1 of H-level, address signal ADD7 of H-level and signal SVIH formed of the voltage level higher than the voltage level in the normal operating range, test mode circuit 2800A receives from registered buffer 20 a second test mode shift signal, which is different from the first test mode shift signal and is formed of signal MRS of H-level, bank address signal BA1 of H-level and address signals ADD7 and ADD9 of H-level, and generates test mode signal TM of H level. As a result, test mode circuit 2800A is formed of the circuit, which generates test mode signal TM of H-level according to the first test mode shift signal, and the circuit, which generates test mode signal TM of H-level according to the second test mode shift signal.

Referring to FIGS. 12–15, description will now be given on the operation of shifting semiconductor memory devices 11A–18A in semiconductor modules 100B and 110B to the test mode. Row address strobe signal /RAS of L-level, column address strobe signal /CAS of L-level, write enable signal /WE of L-level, bank address signal BA1 of H-level and address signal ADD7 of H-level are externally input. Thereafter, registered buffer 20 outputs signal MRS of H-level, bank address signal BA1 of H-level and address signal ADD7 of H-level to semiconductor memory devices 11A–18A. The above operation of externally inputting the signals and the above signal output operation of registered buffer 20 as well as the operations between them are the same as those in the first embodiment already described.

In the third embodiment, when semiconductor memory devices 11A–18A are shifted to the test mode, such an operation is further performed that registered buffer 20 is externally supplied with address signal ADD9 of H-level. Registered buffer 20 outputs address signal ADD9 of H-level to semiconductor memory devices 11A–18A are shifted, similarly to address signal ADD7.

Thereby, test mode circuit 2800A receives signal MRS of H-level, bank address signal BA1 of H-level and address signals ADD7 and ADD9 of H-level, and hold circuits 281–283 output hold signals MRSH, BA1H and ADD7H of H-level to AND gates 285, 288 and 291. Hold circuit 287 outputs hold signal ADD9H of H-level to AND gate 288.

AND gate 285 performs the logical AND among hold signals MRSH, BA1H and ADD7H of H-level, and outputs signal SVDENE of H-level to SVIH detector 286. When signal SVDENE of H-level is input, SVIH detector 286 outputs signal BA0S of L-level to OR gate 289, as already described.

AND gate 288 performs the logic AND among hold signals MRSH, BA1H, ADD7H and ADD9H of H-level, and outputs signal SVIHOFF of H-level to OR gate 289. OR gate 289 performs the logical OR between signal SVDENE of H-level and signal BA0S of L-level, and outputs signal BA0SM of H-level to AND gate 291.

Thereby, AND gate 291 performs logical AND among hold signals MRSH, BA1H and ADD7H of H-level and signal BA0SM of H-level, and outputs test mode signal TM of H-level. Thereby, semiconductor memory devices 11A–18A are shifted to the test mode.

Operations other than the above are the same as those in the first embodiment.

According to the third embodiment, the semiconductor memory devices forming the semiconductor module include the test mode circuits, which generate test mode signal TM for shift to the test mode based on control signals such as row address strobe signal /RAS as well as the bank address signal and the address signal. Therefore, the semiconductor module can operate to shift the semiconductor memory device to the test mode for testing the special operation without requiring external supply of the signal, which is formed of the voltage level higher than the voltage level in the normal operating range.

Fourth Embodiment

Figure 16:
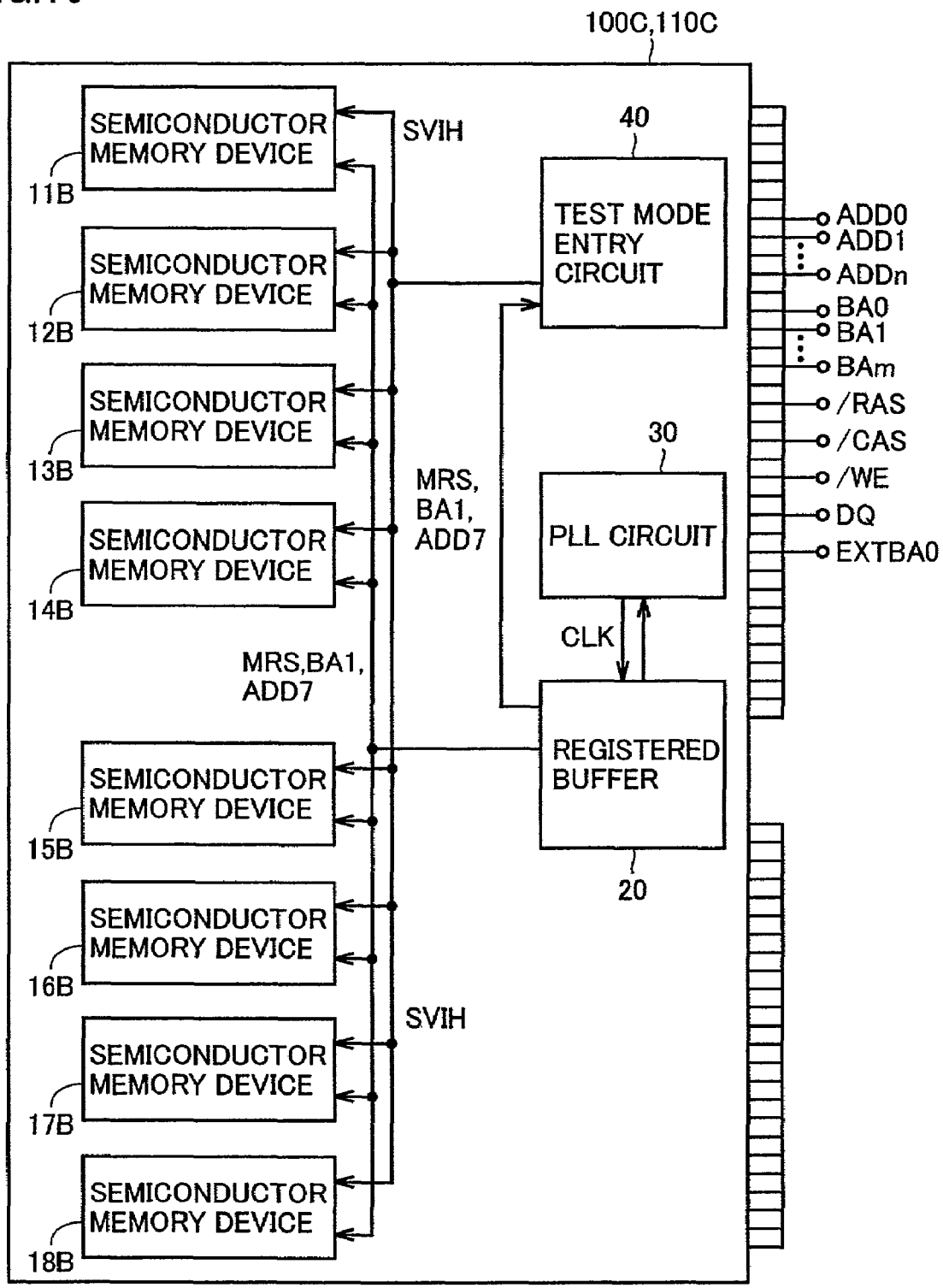
FIG. 16 is a schematic block diagram of a semiconductor module according to a fourth embodiment.

Referring to FIG. 16, semiconductor modules 100C and 110C according to a fourth embodiment employ semiconductor memory devices 11B–18B instead of semiconductor memory devices 11–18 in semiconductor modules 100 and 110. Structures other than the above are the same as those of semiconductor modules 100 and 110. However, test mode entry circuit 40 does not issue signal PLLOFF, which is produced based on signal MRS, bank address signal BA1 and address signal ADD7, to PLL circuit 30.

Semiconductor modules 100C and 110C are used in module 10 instead of semiconductor modules 100 and 110 shown in FIG. 1, and form the RDIMM.

Figure 17:
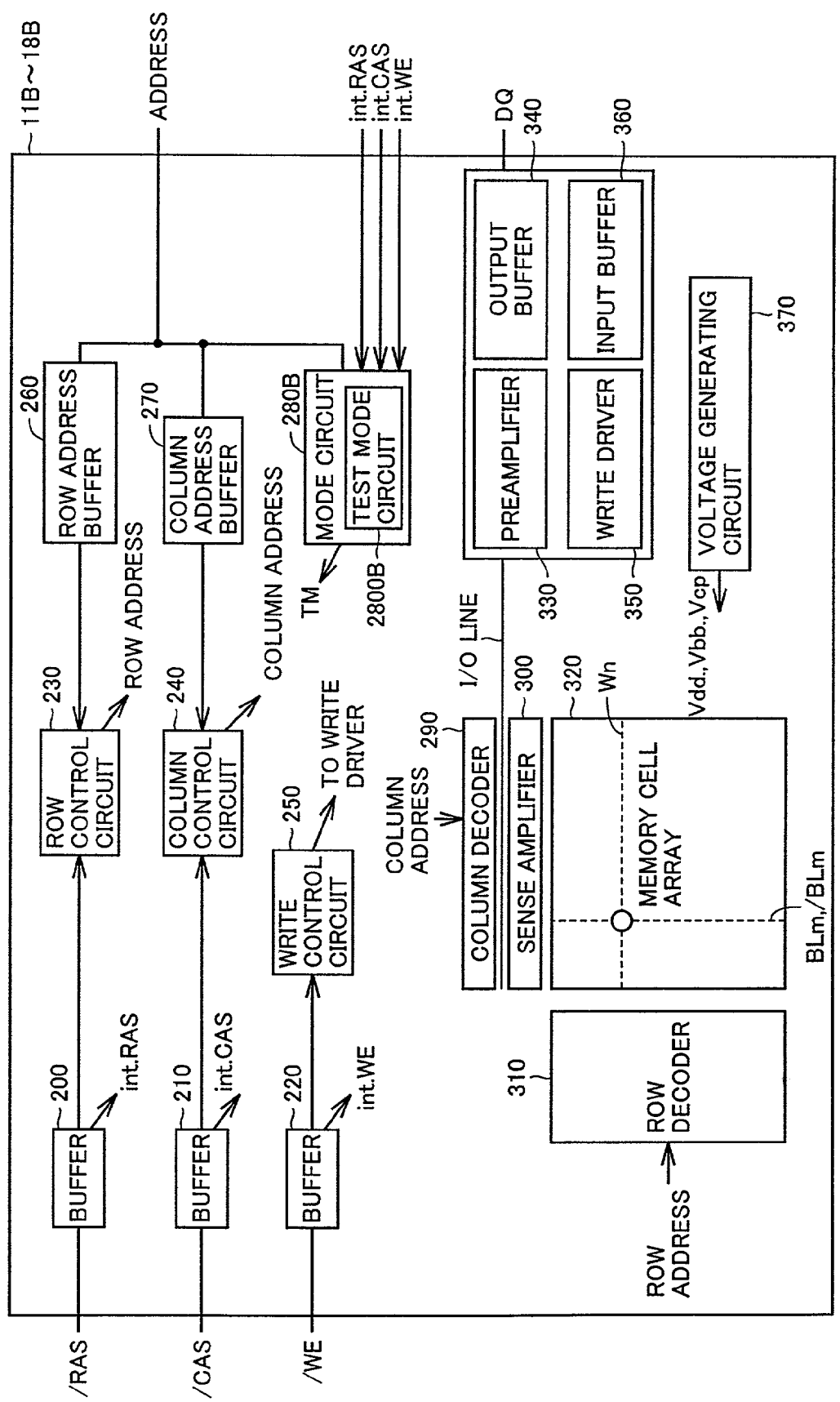
FIG. 17 is a schematic block diagram of a semiconductor memory device shown in FIG. 16.

Referring to FIG. 17, semiconductor memory devices 11B–18B differ from semiconductor memory devices 11–18 in that a mode circuit 280B is used instead of mode circuit 280. Structures other than the above are the same as those of semiconductor memory devices 11–18. In semiconductor memory devices 11B–18B, buffer 200 sends latched row address strobe signal /RAS to row control circuit 230, and also sends internal row address strobe signal int.RAS to mode circuit 280B. Buffer 210 sends latched column address strobe signal /CAS to column control circuit 240, and also sends internal column address strobe signal int.CAS to mode circuit 280B. Further, buffer 220 sends latched write enable signal /WE to write control circuit 250, and sends internal write enable signal int.WE to mode circuit 280B.

Mode circuit 280B includes test mode circuit 2800B instead of test mode circuit 2800.

Figure 18:
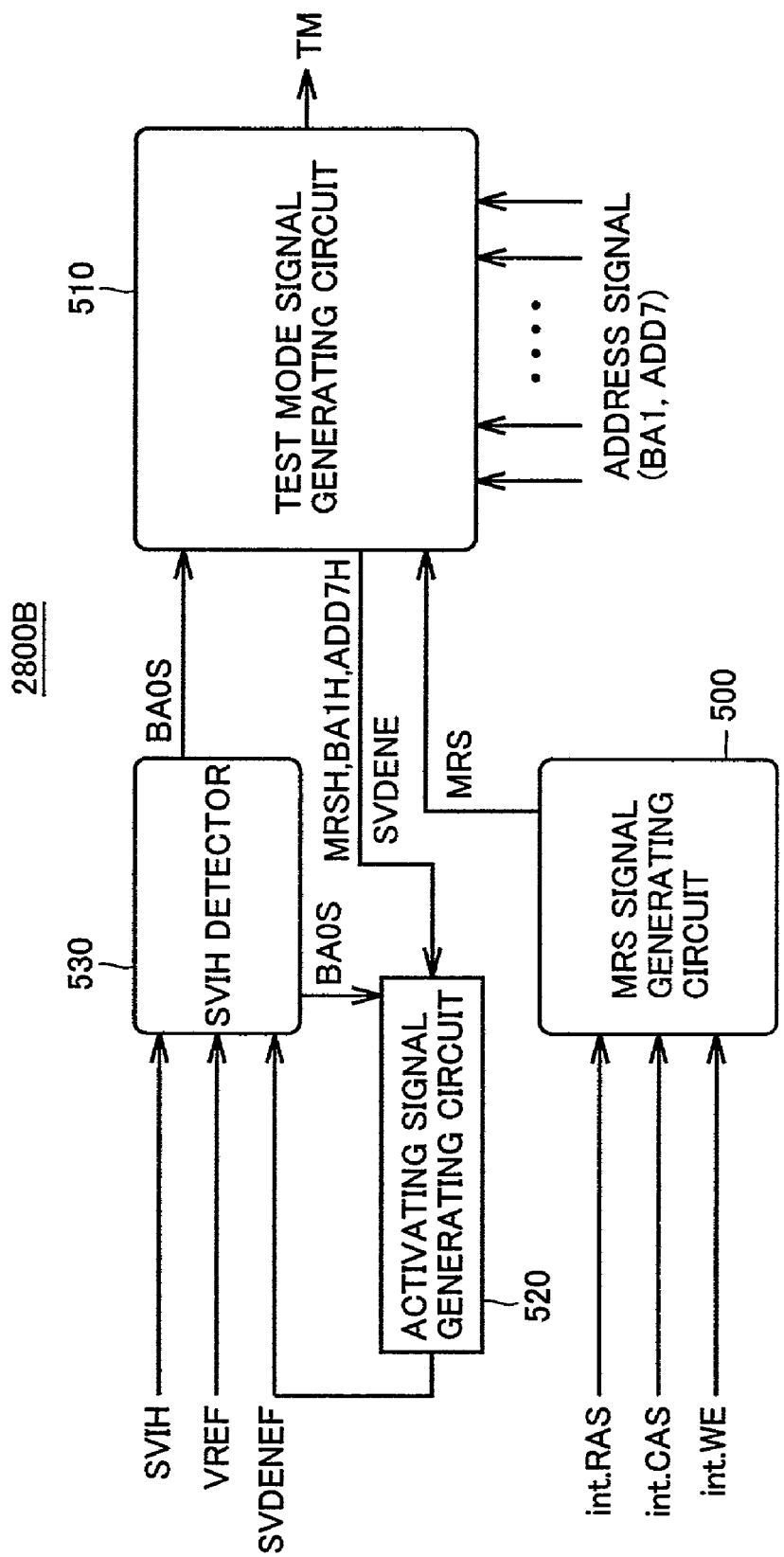
FIG. 18 is a block diagram showing a test mode circuit in a mode circuit shown in FIG. 17.

Referring to FIG. 18, test mode circuit 2800B includes an MRS signal generating circuit 500, a test mode signal generating circuit 510, an activating signal generating circuit 520 and an SVIH detector 530.

MRS signal generating circuit 500 performs the logical AND among internal row address strobe signal int.RAS, internal column address strobe signal int.CAS and internal write enable signal int.WE, and outputs signal MRS, which is a result of the operation, to test mode signal generating circuit 510.

Test mode signal generating circuit 510 generates hold signals MRSH, BA1H and ADD7H and signal SVDENE based on signal MRS, bank address signal BA1 and address signal ADD7, and outputs hold signals MRSH, BA1H and ADD7H and signal SVDENE thus generated to activating signal generating circuit 520. Test mode signal generating circuit 510 generates test mode signal TM based on hold signals MRSH, BA1H and ADD7H thus generated and signal BA0S sent from SVIH detector 530.

Activating signal generating circuit 520 generates a signal SVDENEF for activating SVIH detector 530 based on hold signals MRSH, BA1H and ADD7H and signal SVDENE, and outputs signal SVDENEF thus generated to SVIH detector 530.

SVIH detector 530 is activated when it receives signal SVDENEF of H-level, and thereby it compares the voltage level of signal SVIH with reference voltage level VREF to issue signal BA0S, which has the logical level corresponding to a result of the comparison, to test mode signal generating circuit 510 and activating signal generating circuit 520.

SVIH detector 530 is formed of the circuit structure shown in FIG. 5, and generates signal BA0S of H-level when the voltage level of signal SVIH is higher than reference voltage level VREF. When the voltage level of signal SVIH is lower than reference voltage level VREF, SVIH detector 530 generates signal BA0S of L-level.

Figure 19:
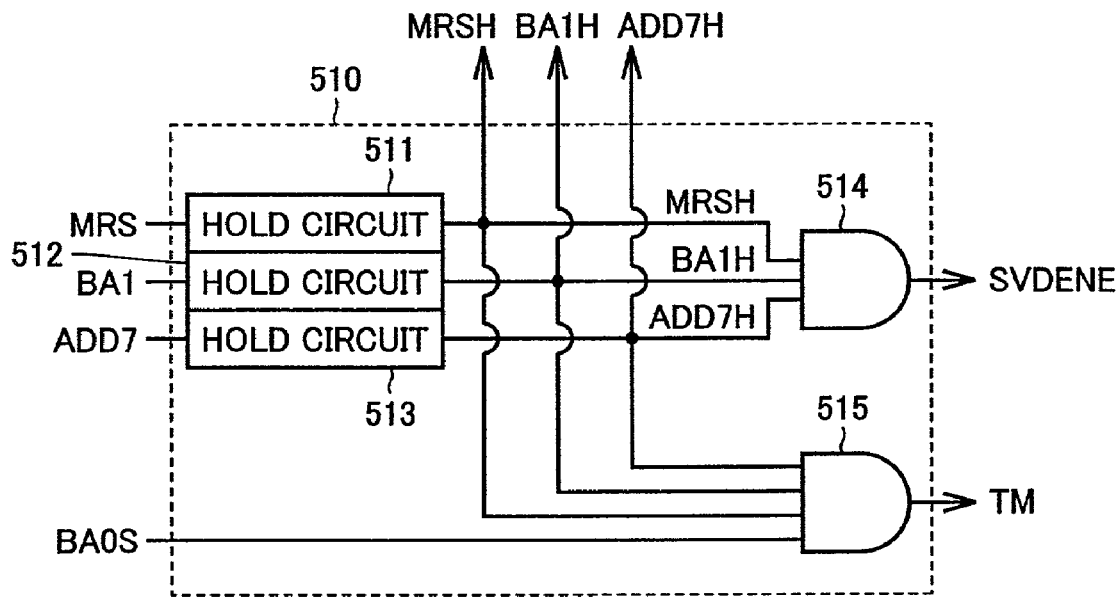
FIG. 19 is a circuit block diagram showing a test mode signal generating circuit shown in FIG. 18.

Referring to FIG. 19, test mode signal generating circuit 510 is formed of hold circuits 511–513, and AND gates 514 and 515. Hold circuit 511 holds signal MRS, which is sent from MRS signal generating circuit 500, for a predetermined period, and outputs hold signal MRSH to AND gates 514 and 515 and activating signal generating circuit 520. Hold circuit 512 holds bank address signal BA1, which is input from registered buffer 20, for a predetermined period, and outputs hold signal BA1H to AND gates 514 and 515 and activating signal generating circuit 520. Hold circuit 513 holds address signal ADD7, which is input from registered buffer 20, for a predetermined period, and outputs hold signal ADD7 to AND gates 514 and 515 and activating signal generating circuit 520.

AND gate 514 performs the logical AND among three hold signals MRSH, BA1H and ADD7H, and outputs signal SVDENE to activating signal generating circuit 520. AND gate 515 performs the logical AND among three hold signals MRSH, BA1H and ADD7H and signal BA0S to output test mode signal TM.

Figure 20:
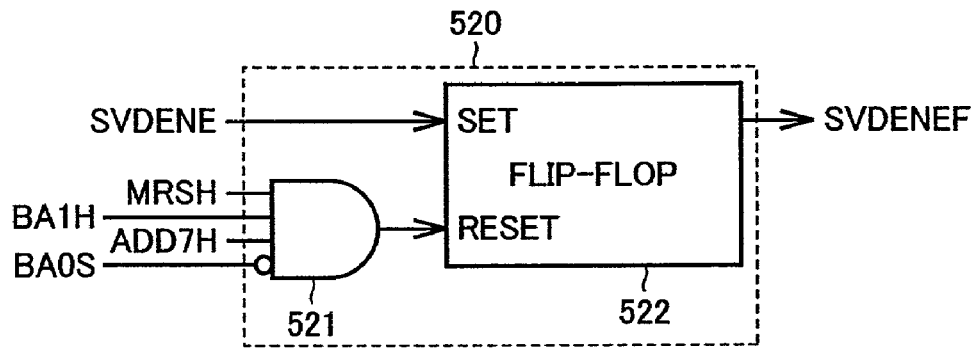
FIG. 20 is a circuit diagram showing an activating signal generating circuit shown in FIG. 18.

Referring to FIG. 20, activating signal generating circuit 520 is formed of an AND gate 521 and a flip-flop 522. AND gate 521 performs the logical AND among hold signals MRSH, BA1H and ADD7H and the inverted signal of signal BA0S, and outputs a result of the operation to a reset terminal RESET of flip-flop 522. Flip-flop 522 receives signal SVDENE from test mode signal generating circuit 510 on its set terminal SET, and thereby outputs signal SVDENEF of H-level to SVIH detector 530 until it is reset.

Referring to FIGS. 16–21, description will now be given on the operation of shifting semiconductor memory devices 11B–18B to the test mode. For shifting semiconductor memory devices 11B–18B to the test mode, registered buffer 20 is supplied from the external terminals with row address strobe signal /RAS of L-level, column address strobe signal /CAS of L-level, write enable signal /WE of L-level, bank address signal BA1 of H-level and address signal ADD7 of H-level. Also, test mode entry circuit 40 is directly supplied from the external terminals with signal EXTBA0 formed of the high voltage level higher than the voltage level in the normal operating range.

Thereby, registered buffer 20 produces signal MRS of H-level based on row address strobe signal /RAS of L-level, column address strobe signal /CAS of L-level and write enable signal /WE of L-level, and outputs bank address signal BA1 of H-level, address signal ADD7 of H-level and signal MRS thus produced of H-level to test mode entry circuit 40. Registered buffer 20 outputs row address strobe signal MRAS of L-level, column address strobe signal /CAS of L-level and write enable signal /WE of L-level to semiconductor memory devices 11B–18B in synchronization with clock signal CLK. Further, registered buffer 20 converts the voltage levels of bank address signal BA1 of H-level and address signal ADD7 of H-level to the voltage levels for use in semiconductor modules 100C and 110C, and outputs bank address signal BA1 and address signal ADD7 of the converted H-level to semiconductor memory devices 11B–18B.

As already described in connection with the first embodiment, test mode entry circuit 40 generates signal SVIH formed of the high voltage level based on signal MRS of H-level, bank address signal BA1 of H-level, address signal ADD7 of H-level and signal EXTBA0 formed of the high voltage level, and outputs signal SVIH thus generated to semiconductor memory devices 11B–18B.

In semiconductor memory devices 11B–18B, buffers 200, 210 and 220 generate internal row address strobe signal int.RAS of H-level, internal column address strobe signal int.CAS of H-level and internal write enable signal int.WE of H-level, respectively, and output them to test mode circuit 2800B. In test mode circuit 2800B, MRS signal generating circuit 500 performs the logical AND among internal row address strobe signal int.RAS of H-level, internal column address strobe signal int.CAS of H-level and internal write enable signal int.WE of H-level, and outputs signal MRS of H-level to test mode signal generating circuit 510. Hold circuits 511–513 of test mode signal generating circuit 510 hold signal MRS of H-level, bank address signal BA1 of H-level and address signal ADD7 of H-level for a predetermined period, respectively, and output hold signals MRSH, BA1H and ADD7H to AND gates 514 and 515 and activating signal generating circuit 520. AND gate 514 performs the logical AND among hold signals MRSH, BA1H and ADD7H of H-level, and outputs signal SVDENE of H-level to activating signal generating circuit 520.

Activating signal generating circuit 520 receives signal SVDENE of H-level on set terminal SET, and outputs signal SVDENEF of H-level to SVIH detector 530. SVIH detector 530 is activated when it receives signal SVDENEF of H-level. Thereby, the operation in one cycle of clock signal CLK ends.

The time required after input of signal MRS of H-level and others and before input of signal SVDENEF of H-level to SVIH detector 530 is the activation time of SVIH detector 530, and the activation operation of SVIH detector 530 is performed within one cycle of clock signal CLK.

In the second cycle, internal row address strobe signal int.RAS of H-level and others are input to test mode circuit 2800B similarly to the first cycle, whereby SVIH detector 530 compares the voltage level of signal SVIH supplied from test mode entry circuit 40 with reference voltage level VREF, and outputs signal BA0S of H-level to test mode signal generating circuit 510.

Thereby, AND gate 515 of test mode signal generating circuit 510 performs the logical AND among signal BA0S of H-level and hold signals MRSH, BA1H and ADD7H of H-level, and outputs test mode signal TM of H-level. Thereby, semiconductor memory devices 11B–18B are shifted to the test mode.

Figure 21:
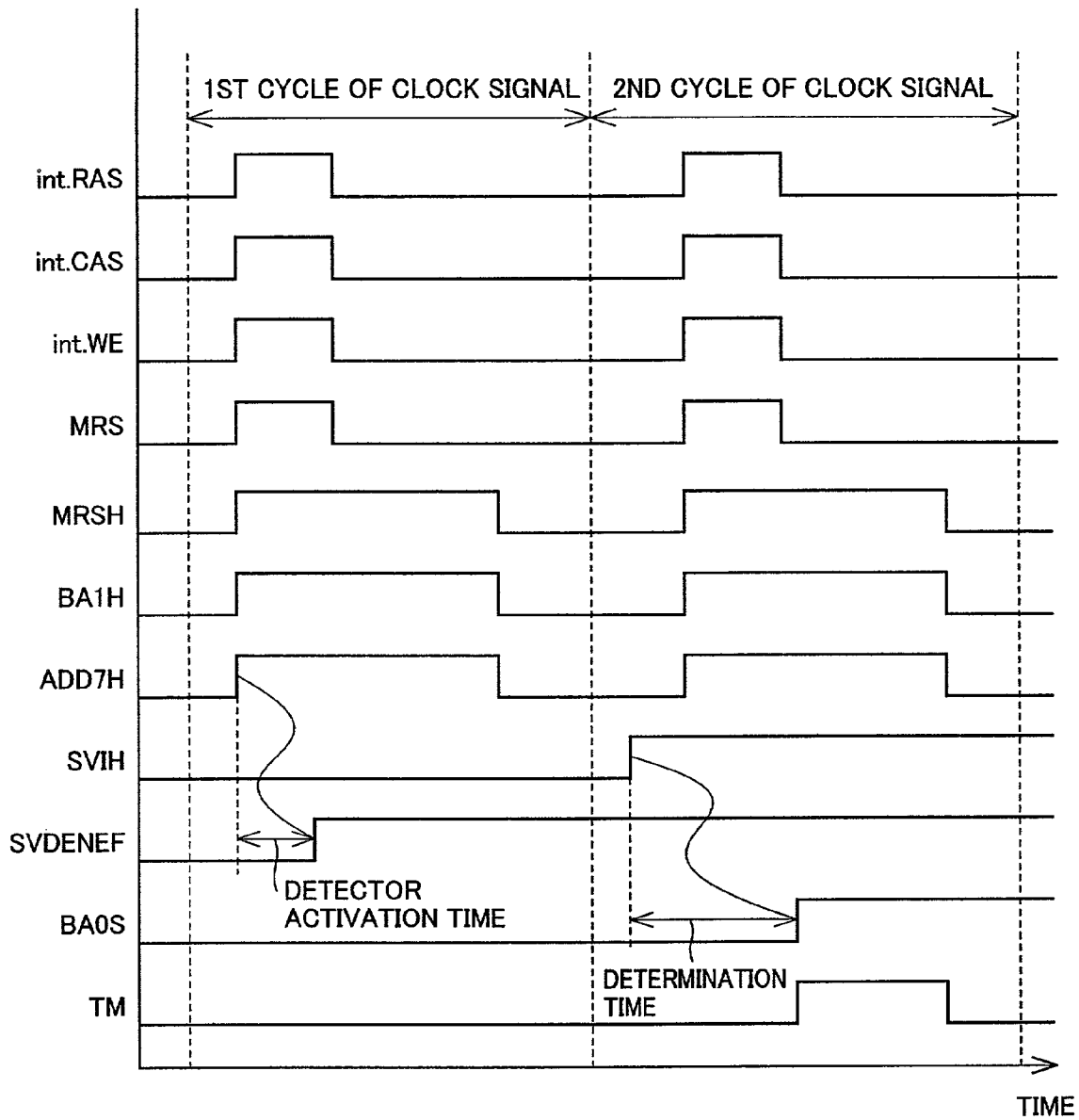
FIG. 21 is a timing chart showing signals in a shift operation of the semiconductor memory device shown in FIG. 17 to the test mode.

As shown in FIG. 21, SVIH detector 530 is activated in the first cycle of clock signal CLK, and the operation of detecting signal SVIH is performed in the second cycle of clock signal CLK. The fourth embodiment has such a distinctive feature that the activation of SVIH detector 530 and the detection of signal SVIH are performed in different cycles, respectively. Thereby, the time of each cycle can be short, and SVIH detector 530 can perform the activation and the detection of signal SVIH in synchronization with clock signal CLK, which has the frequency of 50 MHz or more.

As a result, semiconductor modules 100C and 110C can operate to shift semiconductor memory devices 11B–18B assembled in the modules to the test mode in synchronization with clock signal CLK having the high frequency of 50 MHz or more.

Figure 22:
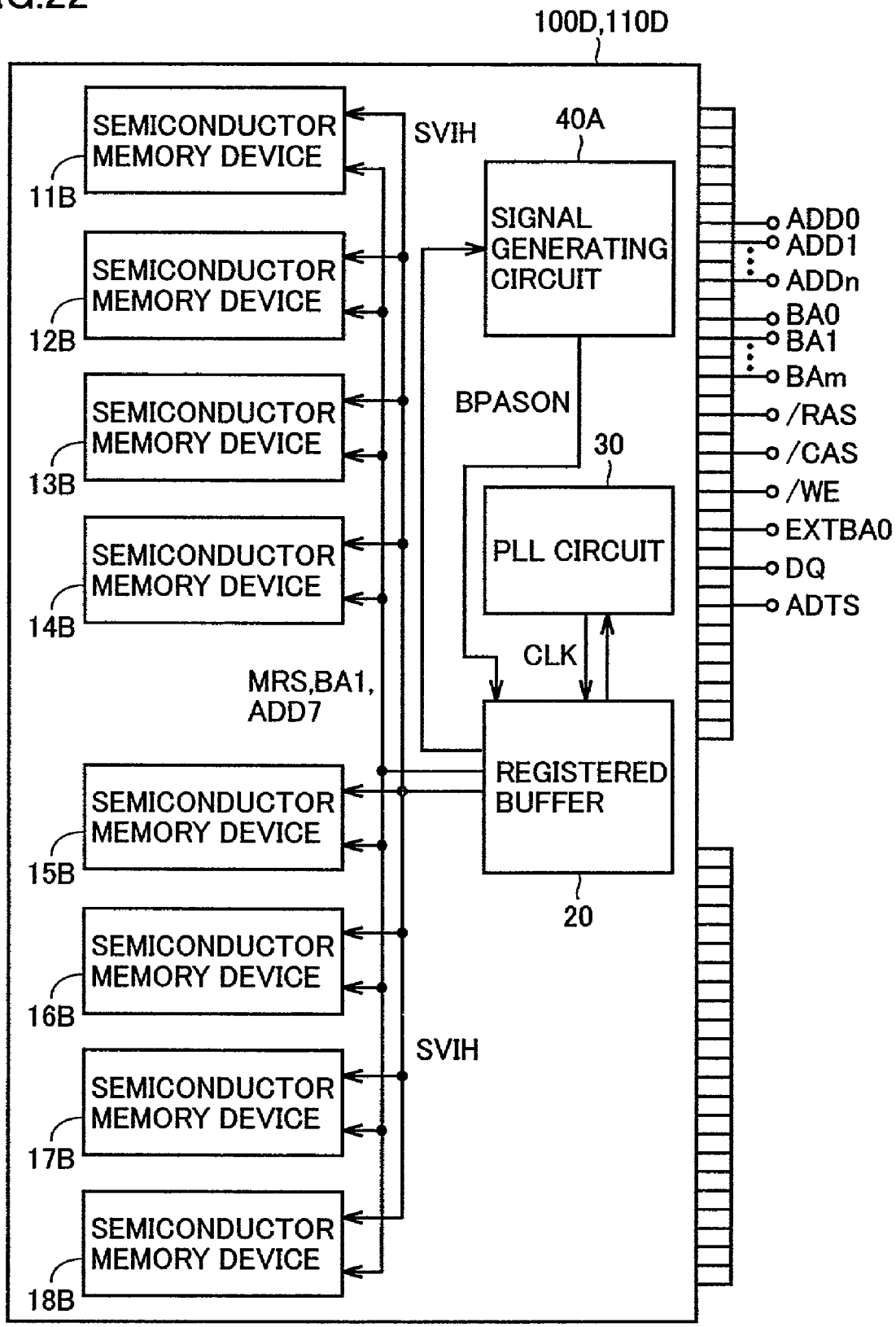
FIG. 22 is another schematic block diagram of the semiconductor module of the fourth embodiment.
Figure 23:
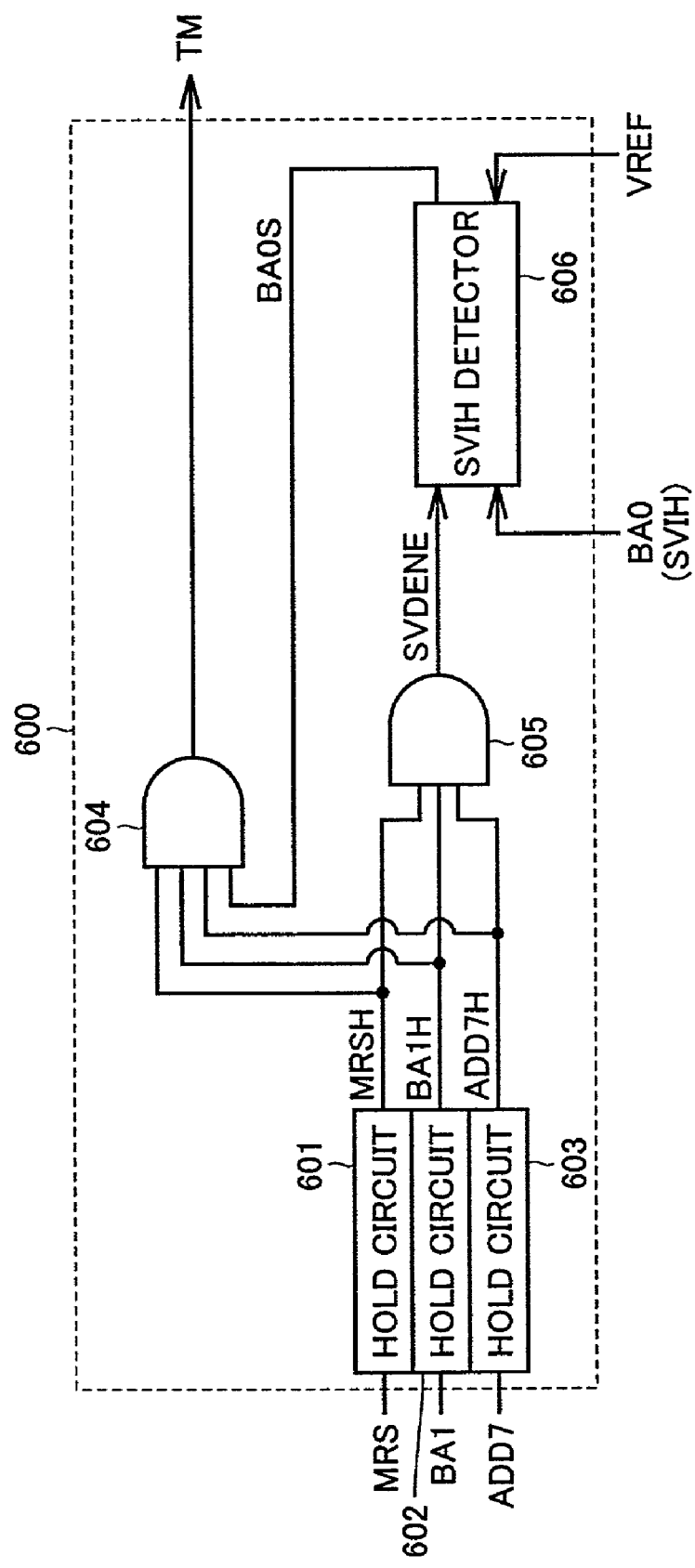
FIG. 23 is a circuit block diagram of a conventional test mode circuit included in a semiconductor memory device.
Figure 24:
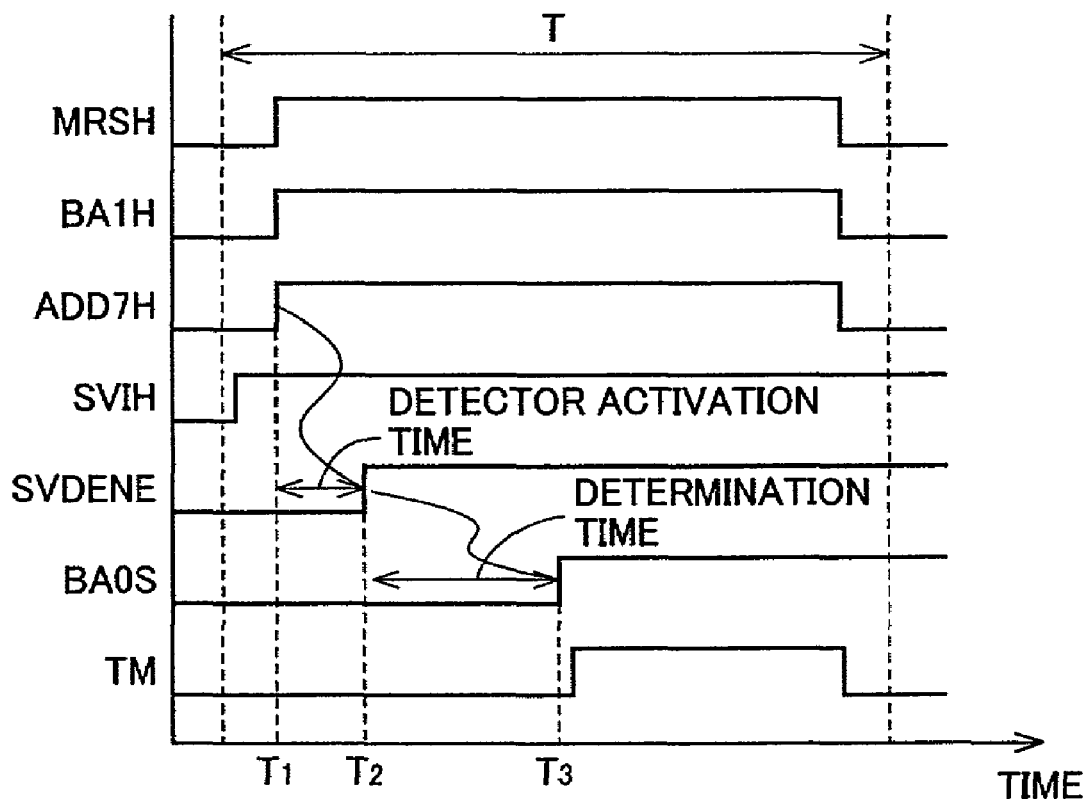
FIG. 24 is a timing chart showing signals in an operation of the test mode circuit shown in FIG. 23.

Semiconductor modules 100D and 110D shown in FIG. 22 may be used as the semiconductor modules in the fourth embodiment. Referring to FIG. 22, semiconductor modules 100D and 11D differ from semiconductor modules 100A and 110A in that semiconductor memory devices 11B–18B are employed instead of semiconductor memory devices 11–18. Structures other than the above are the same as those of semiconductor modules 100A and 110A. In semiconductor modules 100D and 110D, signal generating circuit 40A generates signal BPASON of H-level as described before when shifting to the test mode, and circuit 21 included in registered buffer 20 directly supplies signal EXTBA0, which is formed of the voltage level higher than the voltage level in the normal operating range, as signal SVIH to semiconductor memory devices 11B–18B (see FIGS. 9 and 10).

Therefore, semiconductor memory devices 11B–18B in semiconductor modules 100D and 110D are shifted to the test mode by the same shifting operation as the test mode shifting operation of semiconductor memory devices 11B–18B in semiconductor modules 100C and 110C.

Structures and operations other than the above are the same as those of the first embodiment.

According to the fourth embodiment, the semiconductor module includes the circuit for supplying the signal, which is formed of the high voltage level higher than the voltage level in the normal operating range and is used for shifting to the test mode, to the semiconductor memory devices, and the semiconductor memory device includes the detecting circuit, which performs the activation and the detection of the signal for test mode shifting in the two cycles of the clock signal having the high frequency, respectively. Therefore, the semiconductor memory devices assembled in the module can be shifted to the test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor module for operating at a second speed faster than a first speed and for shifting of semiconductor memory devices to an individual-device test mode, comprising:
   a PLL circuit for generating a clock signal of a frequency for achieving said second speed;
   a registered buffer circuit for converting an externally supplied input signal to an input signal formed of an internally used voltage level, and outputting the converted input signal in synchronization with said clock signal;
   a plurality of semiconductor memory devices for receiving said converted input signal from said registered buffer circuit and operating in synchronization with said clock signal; and
   a test mode entry circuit for producing, in accordance with a request for a shift to the test mode, a test mode shift signal for shifting said semiconductor memory devices to the test mode, said test mode being a test mode used for individually testing each of said plurality of semiconductor memory devices, and applying the produced test mode shift signal to each of said plurality of semiconductor memory devices;
   wherein each of said plurality of semiconductor memory devices includes a memory cell array including a plurality of memory cells, a peripheral circuit for inputting/outputting data to and from each of said plurality of memory cells, and a test mode circuit for generating a test mode signal for testing a special operation different from a normal operation, based on said test mode shift signal, and said peripheral circuit performs input/output of data used for testing said special operation to and from each of said plurality of memory cells in accordance with said test mode signal.

2. The semiconductor module according to claim 1, wherein
   said test mode circuit generates said test mode signal when the voltage level of said test mode shift signal is higher than a reference voltage level, and
   said test mode entry circuit produces the test mode shift signal formed of a high voltage level higher than said reference voltage level and higher than a voltage level in a normal operating range, and applies said test mode shift signal to said test mode circuit.

3. The semiconductor module according to claim 2, wherein
   said test mode entry circuit generates, based on a predetermined signal which is sent from said registered buffer circuit, said test mode shift signal and a deactivating signal for deactivating said PLL circuit, in response to said request for a shift to said test mode and an externally applied input signal formed of a high voltage level.

4. The semiconductor module according to claim 3, wherein
   said test mode entry circuit includes:
   a first signal generating circuit for producing said deactivating signal based on said predetermined signal, and
   a second signal generating circuit being deactivated by receiving said deactivating signal to produce said test mode shift signal when the voltage level of said external input signal is higher than said reference voltage level.

5. The semiconductor module according to claim 2, wherein
   said test mode entry circuit externally receives a predetermined signal requesting shift to said test mode and an external input signal formed of said high voltage level, and applies said external input signal as said test mode shift signal to said semiconductor memory devices.

6. The semiconductor module according to claim 5, wherein
said test mode entry circuit includes:
a signal generating circuit for generating a bypass signal for directly leading said external input signal to said semiconductor memory devices based on said predetermined signal, and
a bypass circuit for directly applying said external input signal to said semiconductor memory devices based on said bypass signal.

7. The semiconductor module according to claim 2, wherein
said test mode circuit is activated in one cycle of said clock signal to detect said test mode shift signal and generate said test mode signal in the subsequent cycle.

8. The semiconductor module according to claim 7, wherein
said test mode circuit includes:
a detecting circuit being activated in said one cycle based on a predetermined signal sent from said registered buffer circuit to detect said test mode shift signal in said subsequent cycle, and
a signal generating circuit for generating said test mode signal in said subsequent cycle when said detecting circuit detects said test mode shift signal.

9. The semiconductor module according to claim 8, wherein
said detecting circuit includes:
a signal generating circuit for generating an activating signal in said one cycle based on said predetermined signal, and
a comparing circuit being activated in said subsequent one cycle based on said activating signal to compare said voltage level of said test mode shift signal with said reference voltage level to output a result of the comparison in said subsequent cycle; wherein
said signal generating circuit generates said test mode signal when the voltage level of said test mode shift signal is higher than said reference voltage level.

10. A semiconductor module for operating at a second speed higher than a first speed and for shifting of semiconductor memory devices to an individual-device test mode, comprising:
a PLL circuit for generating a clock signal of a frequency achieving said second speed;
a registered buffer circuit for converting an externally applied input signal to an input signal formed of an internally used voltage level, and outputting the converted input signal in synchronization with said clock signal;
a plurality of semiconductor memory devices for receiving said input signal from said registered buffer circuit, and operating in synchronization with said clock signal, wherein
each of said plurality of semiconductor memory devices includes a memory cell array including a plurality of memory cells, a peripheral circuit for inputting/outputting data to and from each of said plurality of memory cells, and a test mode circuit for generating a test mode signal for testing a special operation other than a normal operation, based on a test mode shift signal received from said registered buffer circuit in the test mode, and wherein said peripheral circuit performs input/output of data for testing said special operation to and from each of said plurality of memory cells in accordance with said test mode signal.

11. The semiconductor module according to claim 10, wherein
said test mode circuit generates said test mode signal based on a second test mode shift signal different from a first test mode shift signal used for shifting said semiconductor memory devices to the test mode.

12. The semiconductor module according to claim 11, wherein said test mode circuit is formed of:
a first circuit for generating said test mode signal based on said first test mode shift signal, and
a second circuit for generating said test mode signal based on said second test mode shift signal; wherein
said second circuit receives said second test mode shift signal from said registered buffer circuit.

13. A semiconductor memory device for use in a semiconductor module operating in synchronization with a clock signal formed of a frequency achieving a second speed higher than a first speed and for shifting to an individual-device test mode, comprising:
a memory cell array including a plurality of memory cells;
a peripheral circuit for inputting/outputting of data to and from each of said plurality of memory cells; and
a test mode circuit for generating a test mode signal for testing a special operation different from a normal operation based on a test mode shift signal sent from a buffer circuit included in said semiconductor module when shifted to the test mode; wherein
said peripheral circuit performs input/output of data for testing said special operation of each of said plurality of memory cells in accordance with said test mode signal; and wherein
said test mode circuit is activated in one cycle of said clock signal to detect said test mode shift signal and generate said test mode signal in the subsequent cycle.

14. The semiconductor memory device according to claim 13, wherein
said test mode circuit includes:
a detecting circuit being activated in said one cycle based on a predetermined signal sent from said buffer circuit to detect said test mode shift signal in said subsequent cycle; and
a signal generating circuit for generating said test mode signal in said subsequent one cycle when said detecting circuit detects said test mode shift signal.

15. The semiconductor memory device according to claim 14, wherein
said detecting circuit includes:
a signal producing circuit for producing an activating signal in said one cycle based on said predetermined signal, and
a comparing circuit being activated in said subsequent one cycle based on said activating signal to compare said voltage level of said test mode shift signal with said reference voltage level to output a result of the comparison in the subsequent cycle; wherein
said signal generating circuit generates said test mode signal when the voltage level of said test mode shift signal is higher than said reference voltage level.

16. The semiconductor memory device according to claim 13, wherein
said test mode circuit generates said test mode signal based on a second test mode shift signal different from a first test mode shift signal used for shifting said semiconductor memory devices to the test mode.

17. The semiconductor memory device according to claim 16, wherein
said test mode circuit is formed of:
a first circuit for generating said test mode signal based on said first test mode shift signal, and
a second circuit for generating said test mode signal based on said second test mode shift signal, said second circuit receiving said second test mode shift signal from said buffer circuit.

* * * * *